(12) United States Patent
Zebermann et al.

(10) Patent No.: US 6,392,319 B1
(45) Date of Patent: May 21, 2002

(54) MODULAR ELECTRICAL APPARATUS

(75) Inventors: Christoph Zebermann, Beverungen; Jens Pilgrim, Vlotho; Manfred Wilmes, Detmold; Michael Schnatwinkel, Schmiedestrasse; Rudolf Steinmeier; Walter Hanning, both of Detmold, all of (DE)

(73) Assignee: Weidmüller Interface GmbH Co., Detmold (DE)

( * ) Notice: Subject to any disclaimer, the term of this patent is extended or adjusted under 35 U.S.C. 154(b) by 0 days.

(21) Appl. No.: 09/490,699

(22) Filed: Jan. 24, 2000

(30) Foreign Application Priority Data

Jan. 25, 1999 (DE) .......................................... 199 02 745

(51) Int. Cl.⁷ ................................................ H02B 1/26
(52) U.S. Cl. ........................ 307/147; 439/532; 439/716
(58) Field of Search ................................ 439/532, 716; 307/147

(56) References Cited

U.S. PATENT DOCUMENTS

| | | | | |
|---|---|---|---|---|
| 5,037,310 A | * | 8/1991 | Marinello | 439/716 |
| 5,071,356 A | * | 12/1991 | Strate et al. | 439/716 |
| 5,588,881 A | * | 12/1996 | Eggert et al. | 439/716 |
| 5,615,079 A | * | 3/1997 | Eggert et al. | 439/716 |
| 5,629,831 A | * | 5/1997 | Eggert et al. | 439/716 |
| 5,658,172 A | * | 8/1997 | Schmidt et al. | 439/716 |
| 5,722,862 A | * | 3/1998 | Glathe et al. | 439/709 |
| 5,741,142 A | * | 4/1998 | Drux et al. | 439/716 |
| 5,759,071 A | * | 6/1998 | Hanning et al. | 439/716 |
| 5,775,955 A | * | 7/1998 | Graube et al. | 439/716 |
| 5,853,304 A | * | 12/1998 | Landreau et al. | 439/716 |
| 6,019,643 A | * | 2/2000 | Barrat et al. | 439/716 |
| 6,027,380 A | * | 2/2000 | Hanning et al. | 439/716 |
| 6,033,257 A | * | 3/2000 | Lake et al. | 439/716 |
| 6,059,439 A | * | 5/2000 | Besnard | 364/138 |
| 6,146,213 A | * | 11/2000 | Yoon | 439/532 |
| 6,191,948 B1 | * | 2/2001 | Beyer | 307/147 |
| 6,241,561 B1 | * | 6/2001 | Zebermann et al. | 439/716 |

FOREIGN PATENT DOCUMENTS

| | | |
|---|---|---|
| DE | 296 11 543 U 1 | 10/1996 |
| DE | 197 34 709 C 1 | 12/1998 |
| EP | 0 709 933 B1 | 11/1999 |

* cited by examiner

Primary Examiner—Josie Ballato
Assistant Examiner—Roberto Rios
(74) Attorney, Agent, or Firm—Lawrence E. Laubscher, Sr.

(57) ABSTRACT

An electrical apparatus having a modular structure is characterized by a connection module that can be mounted on a carrier rail that is provided with connection levels including double or multiple connections and a serial alignment of disk-shaped base terminal carriers. Several power supply elements are provided on the terminal carriers, the elements being connected to the connection levels via bus bars of the disk-shaped base terminal carriers. The bus bars extend only on one of the sides of the base terminal carrier to the pertinent multiple connections. With the use of base terminal carriers, both a block structure and a disk structure as well as a combination of the two can be constructed.

46 Claims, 23 Drawing Sheets

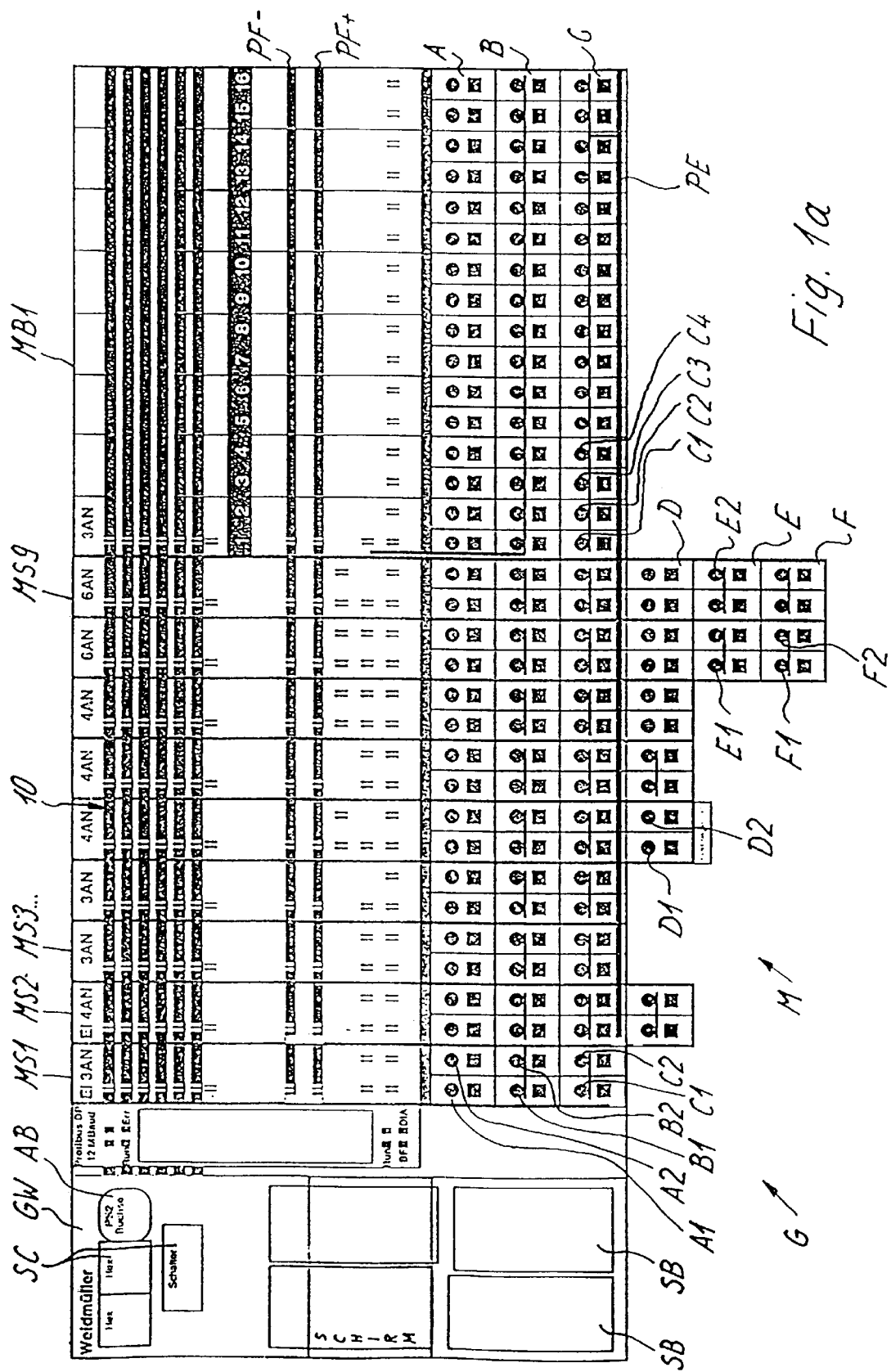

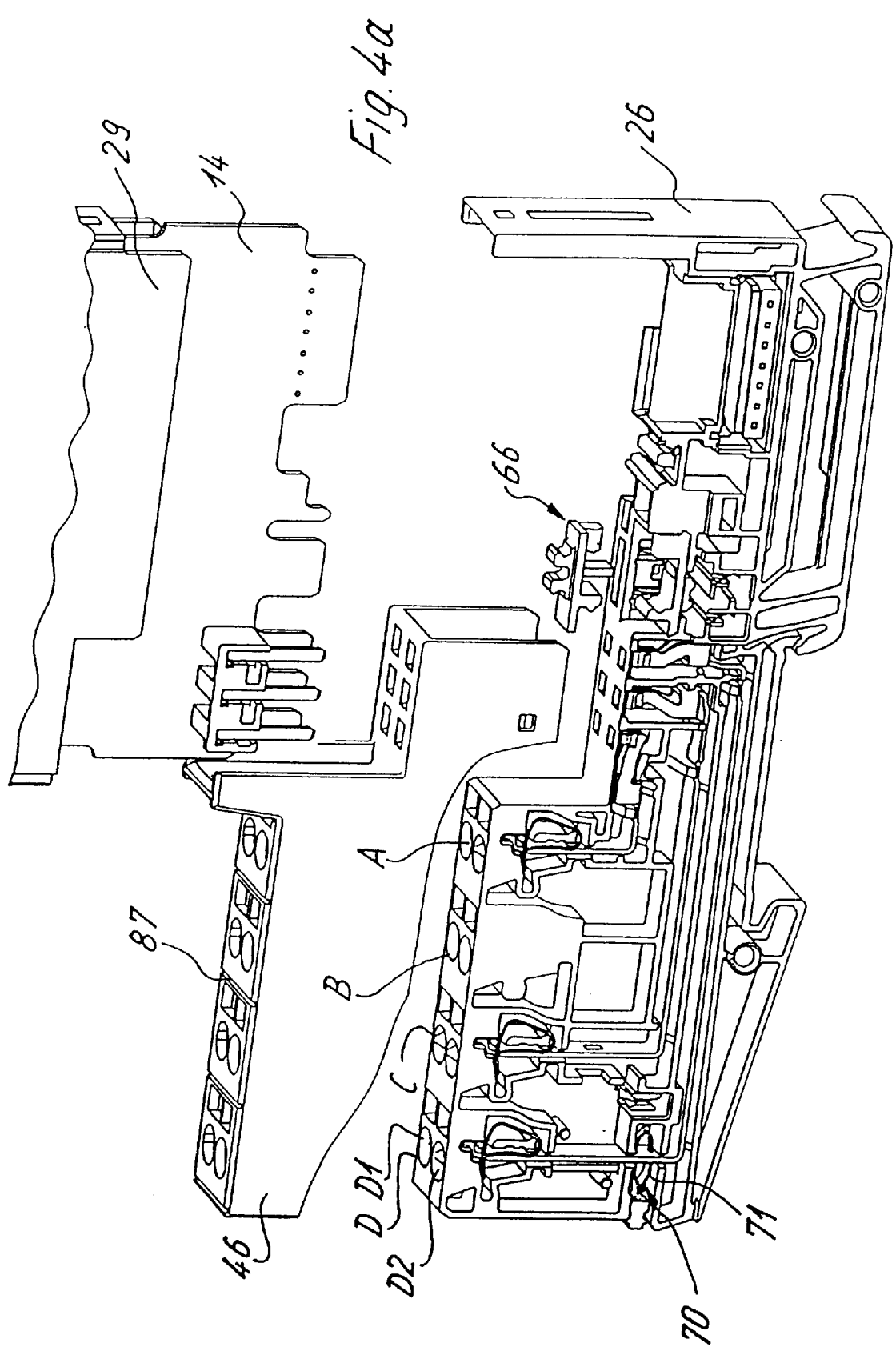

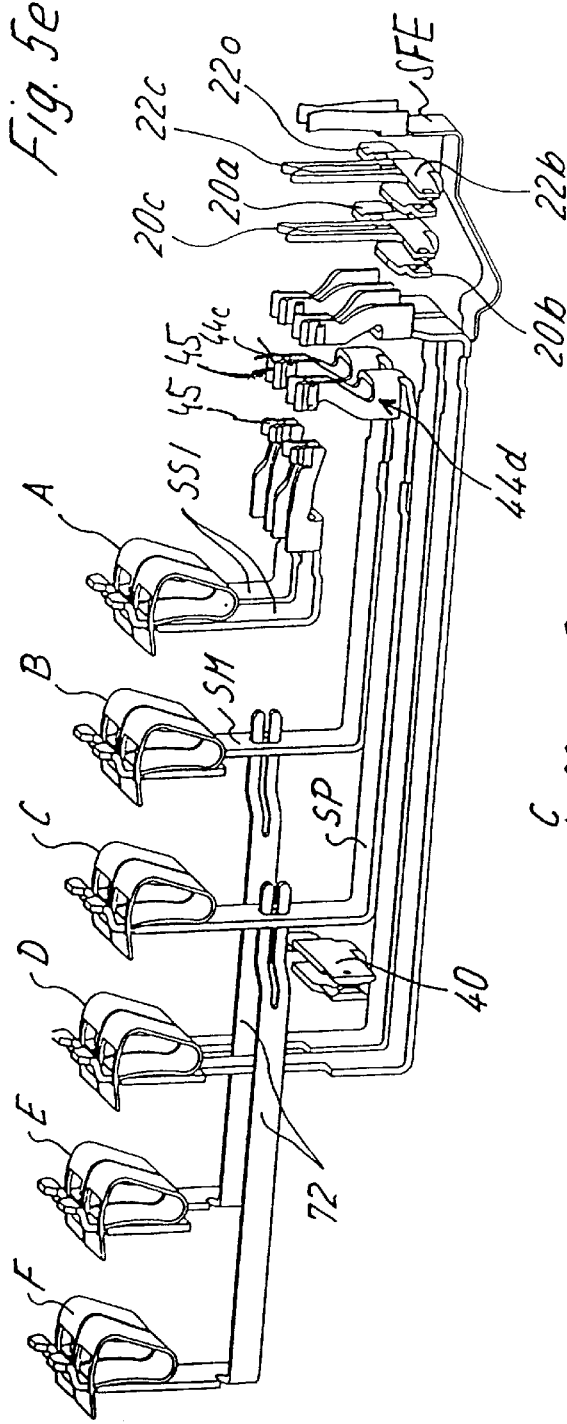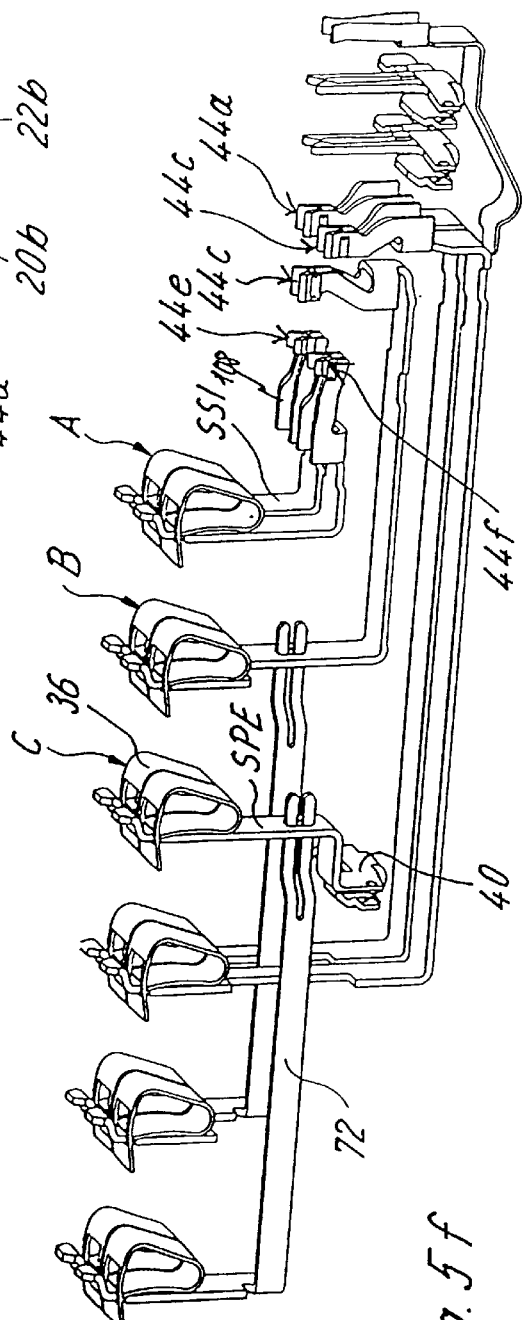

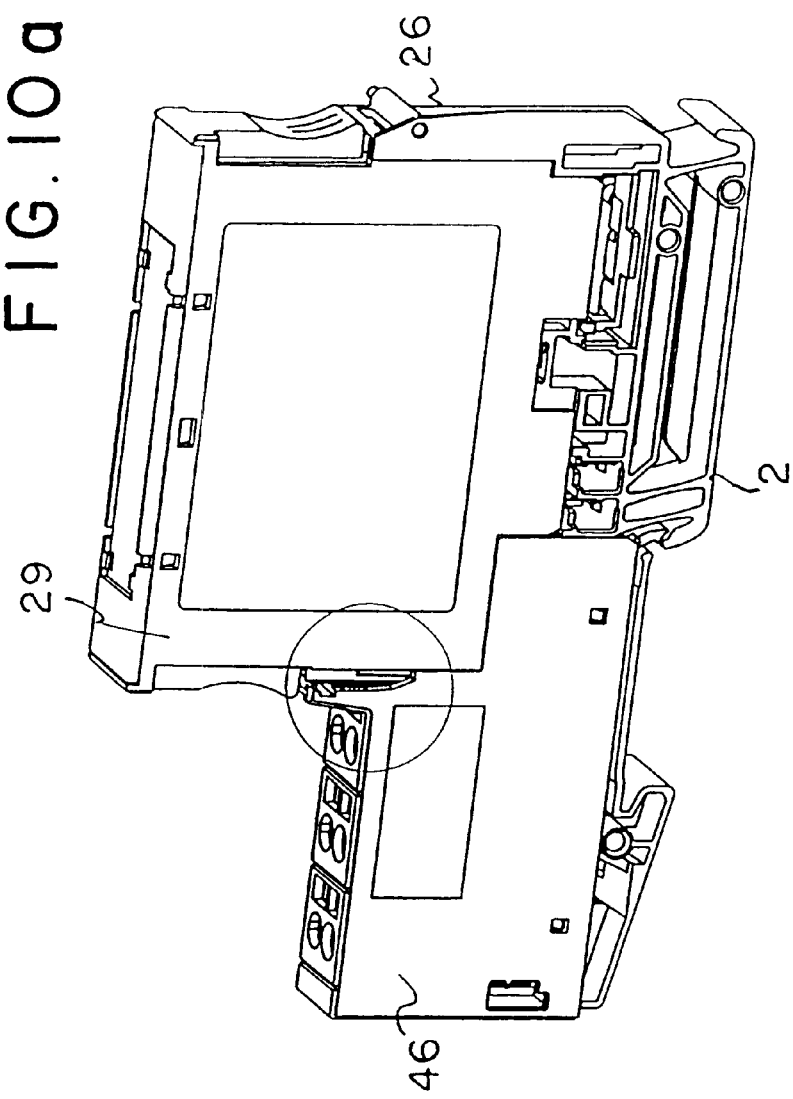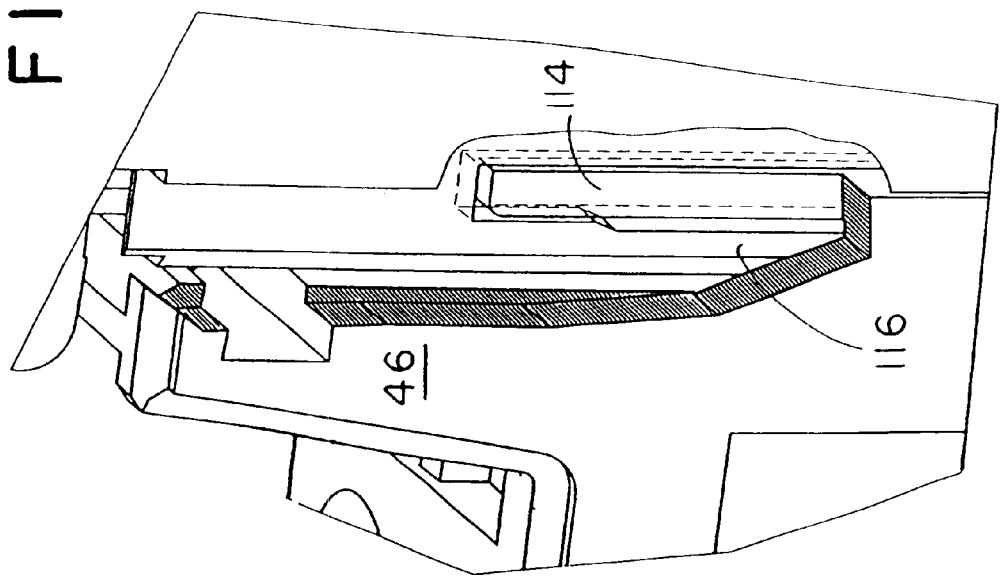

MODULAR ELECTRICAL APPARATUS

BACKGROUND OF THE INVENTION

The present invention relates to an electrical apparatus having a modular structure for the control or monitoring of technical processes or for industrial or building automation with at least one connection module that can be mounted on a carrier rail. The apparatus is provided with several levels of connection for connection with external conductors and includes a row of disk-shaped base terminal carriers. Within each connection module and parallel to the carrier rail, an internal bus conductor and several electrical potential supplies are arranged. The electrical potential supplies are connected via bus bars of the disk-shaped base terminal carriers and via other elements to the connection levels.

BRIEF DESCRIPTION OF THE PRIOR ART

Such an electrical apparatus is known from EP 95 113 730 A1. The apparatus disclosed in this publication has an internal bus conductor and connection blocks that are aligned on carrier rails and that are used for adapting signals between a superordinate field bus and switches, field apparatus or the like that are connected to the connection blocks. The connection blocks are made up of functionally different connection or module disks, including protective conductor or ground disks, supply disks, signal conductor disks and notch foot disks. One or several connection blocks can be connected via the internal bus conductor to a connection module for a field bus.

This prior electrical apparatus was effective. However, further simplification of the structure of the individual connection disk and a reduction in the number of connection disks of various types to form a connection block or connection module is desirable.

The present invention was developed to simplify the structure of the individual connection disks and reduce the dimensions of the modular electrical apparatus.

SUMMARY OF THE INVENTIONS

According to the invention, the bus bars for the electrical supply to the connection levels are distributed on both sides of the base terminal carrier and the bus bars of each individual electrical potential are guided only on one of the sides of the base terminal carrier to the pertinent connections. The connections that are supplied with one and the same electrical potential are connected directly with each other to form multiple connections.

As a result, it is no longer necessary to supply the two or more individual connections for disk or block structures, respectively, of each multiple connection individually via separate bus bars to the desired potentials. Rather, both the positive and the negative potential as well as the ground potential can be guided via only one bus bar branch on one of the sides of the plastic base disks to the multiple connections that are then directly connected with each other in the particular connection levels. To differentiate the signals of the connected devices, only the signal connections need still be guided over separate bus bars from the connection levels to the electronics of the connection module.

The present invention uses the bus bar guide layout set forth above in a module system where each connection module includes any number of alignable and mutually combinable module disks and module blocks that in each case are arranged on alignable base terminal carriers. The base terminal carriers can also be designed in disk form or in block form, although preference is given to the disk-type structure.

The particular base terminal carriers of the module disks and of the module blocks each have an electronic printed circuit board, an electronic housing and a cover. Furthermore, the electronic printed circuit board, the electronic housing and the cover of the module blocks in each case span several base terminal carriers, while the cover and preferably the electronic printed circuit board and the electronic housing of the module disks only span one of the base terminal carriers. Because module disks and module blocks are formed of identical and compatible base elements, it is possible to combine the block structure and the disk structure with each other in any desired fashion.

Depending on the particular manner of use, a reasonably priced connection module structure is available. Thus, a pure block structure for a larger number of connection devices of the same design results in cost savings. On the other hand, in the case of a few external devices, this can result in higher cost. With the present invention, it is possible to select the most favorable combination of block and disk structures for the desired use. The common base elements, both of the block structure and the disk structure, in each case are the base terminal carriers which receive the electronic printed circuit board. As an alternative, it is also possible that one of the electronic printed circuit boards and one of the electronic housings might span several aligned module disks or several electronic printed circuit boards are inserted in the electronic housings of the module blocks.

It is also possible that the module block and in particular, its base terminal carrier, comprises a lower part and a disk element on top.

The bus bar layout of the present invention can be implemented with the bus bars for the positive and negative potentials and additional bus bars for signal transmission inserted in lateral recesses of the base terminal carrier. The recesses extend from the connection levels with the double or multiple connections to connection openings for the purpose of receiving a plug on the electronic printed circuit board and/or the edge of the electronic printed circuit board into the base wall of the recess of a base terminal carrier.

The bus bar for connecting the ground connector to the connection level for the ground potential is preferably integrally molded upon the cross members of the ground. It is also advantageous when the terminal areas of the bus bars (and the functional ground contact) are made as connection contacts for connection of additional bus bars or printed circuit board edges, or when the terminal areas of the bus bars are made at least on one side, as receptacles for the contacts, the apparatus plug, or the edge of the electronic printed circuit board.

If more than four connection levels are desired, the bus bars are placed separately or integrally with extension bus bars to bridge the potentials between the various connection levels of the base terminal carriers. The latter are placed against the particular bus bar that is to be extended and turned by 90° with elastic ends. The elastic segments engage openings of the particular bus bar that is to be extended. Alternatively, the terminal areas of the extension bus bars engage elastic receiving sockets of the particular bus bar that is to be extended.

According to a further object of the invention, the supply of various electrical potentials within the module blocks occurs via the potential conductors in the area of the base terminal carriers facing, the carrier rail or between the multiple connections of a connection level by cross-connectors that are provided with stubs that engage receiving sockets elastically molded on the bus bars. As a result of the cross-connectors, it is not necessary in a module block to run separate bus bars to the connection levels in each base terminal carrier. The electrical potential supply takes place, for instance, only once when the performance within the module block remains uniform over the entire module block. Only the signal levels are still connected individually to the electronic supply of the module block via the terminal carriers. This simplifies the design of the module block and further provides the simplest possible bus bar guidance on the terminal carrier of the module disks with double connections in the direction toward a multiple connection system for the module blocks. The cross-connectors also reduce the plug-in and extraction forces during the removal and insertion of the electronic device.

The use of extension bus bars can also be implemented with the module block. Preferably, those bus bars are turned by 90° and at their ends they are provided with receiving sockets extending upwardly for contacting cross-connectors. The extension bus bars are separated from the electrical potential of the bus bars of other connection levels by separately insertable insulation disks or by insulation disks that are sprayed upon the base terminal carrier. It is also possible to arrange the PE (protective ground) cross members in the module blocks perpendicularly in the lateral recesses of the base terminal carrier and the ground cross member has a receiving socket at its ends for contacting the cross-connectors and a receiving socket for contacting the PE bus bar.

The cross-connectors are inserted in the cover and, as the cover is mounted on the aligned base terminal carriers of the module block, they engage the base terminal carriers and in each case form at least one contact sector of the multiple connections. Preferably, the electrical potential is varied within a connection level of a module block by several cross-connectors of different length and extension bus bars that can be positioned as desired in lateral recesses of the base terminal carriers. In a module block, the electronic printed circuit board is preferably connected via the first base terminal carrier of the module block.

The modular electrical apparatus can be used with a system that can be easily understood and viewed by the user by way of a gateway with a simple housing design for the connection of an external field bus which is always connected via a feed disk designed as a module disk. To avoid a separate power supply to the gateway, the current and voltage supply of the gateway and that of the connection module is handled via the feed disk aligned against the gateway. The gateway is designed so that it can be coupled directly to the base terminal carrier and the internal bus conductor segment of the feed disk. The module system of the invention is completed by a closure plate, preferably with an insertable, separate end angle.

According to another object of the invention, the last module disk of the connection module of the electrical apparatus, preferably its EA (electrical connection) module housing, is provided with a connection or a plug to relay the internal bus conductor or the electrical potentials to another module disk having the same structure for additional connection modules of the electrical apparatus without their own gateways that are on another carrier rail. This results in the operation of several connection modules with only one single gateway and further reduces the costs of the system.

As an alternative, it is also possible to replace the signal-conducting bus bars with light conductor elements.

BRIEF DESCRIPTION OF THE FIGURES

Other objects and advantages of the invention will be apparent from a study of the following specification when viewed in the light of the accompanying drawing, in which:

FIGS. 1a–1d are diagrams illustrating the structure of connecting modules of electrical apparatus according to the invention.

FIGS. 3b–3d are front, top, and rear views, respectively, of the base terminal carrier with bus bars to the module disk of FIG. 3a;

FIG. 4a is an exploded view of a second embodiment of a module disk with four connection levels;

FIGS. 4b–4d are front, top, and rear views, respectively, of the base terminal carrier of the module disk of FIG. 4a;

FIGS. 5b–5d are front, top, and rear views, respectively, of the base terminal carrier of the module disk in FIG. 5a;

FIGS. 5e and 5f are two bus bar arrangements, respectively, for module disks with six connection levels;

FIG. 7b shows a bus bar arrangement for the module block in FIG. 7a;

FIGS. 7c and 7d are exploded views, respectively, of elements of the module block from FIG. 7a;

FIGS. 10a and 10b are plan and detailed views, respectively, of a module disk of FIG. 3 with an electronic housing thereon.

DETAILED DESCRIPTION

Figure 1B:
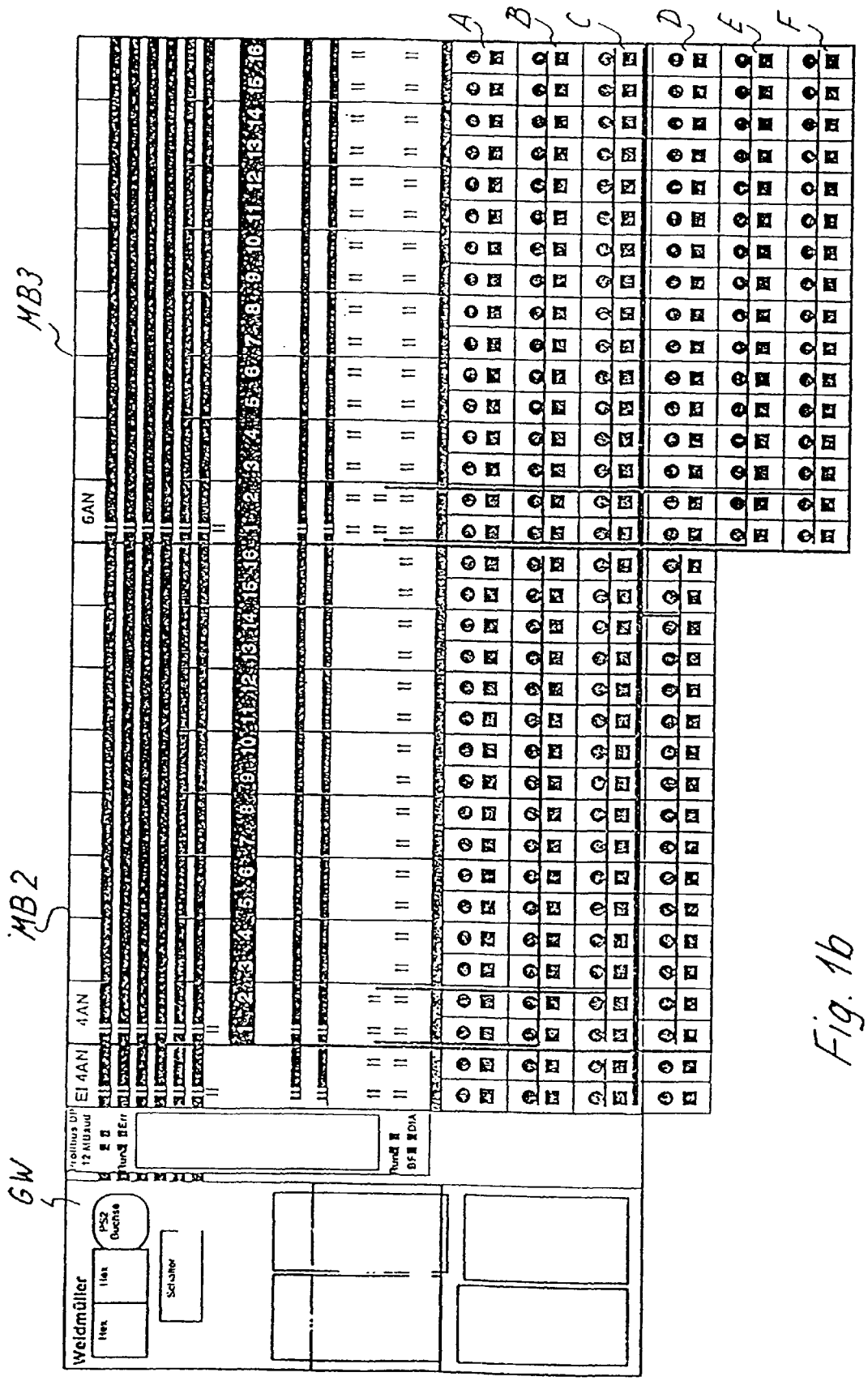

FIGS. 1a to 1d are diagrams illustrating various electrical apparatus G from automation technology that can be arranged on a carrier rail. Apparatus G comprises a gateway GW upon which connection modules M in disk form (module disks MS) and/or block form (module blocks MB1-MB3) can be serially aligned. Electrical apparatus G makes it possible to monitor and/or control external electrical devices (field devices, switches, controllers, etc.) that can be connected to the connection modules of the electrical apparatus of the invention.

Gateway GW has an electronic unit (not shown) and is provided with connection elements SB for the connection of various external field bus systems for supplying an internal bus conductor segment 10 and with additional interfaces AB (for example, PS2 socket, screen, pin strips) and switch(es) SC. Adjoining gateway GW in the version shown in FIG. 1 are the connection modules M of various types that, depending on design, are designed either for the connection of certain specific external electrical devices (connection module disk) or for power feed into the system (feed-in module disk).

The first module disk MS1 adjacent to the gateway labeled "MAN" is used for supplying electrical potentials via connections A1, A2 to C2 into the electrical devices. These potentials are conducted from connections A1, A2, etc., via bus bars and possibly strip conductors (not shown) into the gateway or via power supply elements PF−, PF+ into additional module disks MS and/or module blocks MB. Something similar applies to the second serially aligned module disk MS2 (E14AN), which due to the larger number of connections for external conductors makes it possible to feed additional, distinct electrical potentials into the system. In particular, one can feed in an additional ground potential via the fourth connection level D to the power supply element PE. Adjacent to an individual gateway, in each case there must be only one of the two feed-in or supply disks MS1 or MS2, and the two variants illustrated are used merely to illustrate various embodiments of feed-in disks. Adjoining the feed-in disks are additional module disks MS3 to MS9 (connection module disks) that are labeled 3AN, 4AN or 6AN. This indicates that three, four or six of the connection levels A, B, C, . . . are provided for the connection of external conductors. As an example, the individual connections can be made in the form of screw or traction spring devices. Additional feed-in disks MS1, MS2 may be placed between the connection disks MS3, MS4, MS5 for power supply or renewed system supply. The same applies to module blocks MB1 to MB3 with three, four or six connection levels with multiple connections, B1, B2, B3, B4, . . . .

Each of the module disks has two rows of connections A1, B1, . . . or A2, B2, etc. Connection levels A and possibly also D have individual connections A1, A2, D1, D2 for signal transmission to/from the externally connected devices. Each of the additional connection levels B, C, E, F and possibly also D of module disks MS is provided for power supply with double connections (for example, in the case of the block structure, multiple connections B1, B2, B3, . . .). This means that per module disk MS in each connection row, one can connect one or two (or in special embodiments even more) external electrical devices. The different number of connection levels makes it possible, depending on the type of appliance to be connected, to use a module disk MS with only as many connections as are absolutely needed for the particular device. For instance, in case of one device, depending whether one switches positively or negatively, one needs only the following three connections: (1) signal S; (2) negative (or positive "+"); and (3) protective ground "PE." This problem can be solved with the help of the connection terminals labeled "3AN." If additional connections should become necessary or if four devices are to be connected per module disk MS, then, on the other hand, a connection terminal with four or six connection levels is selected. If an entire row of external electrical devices with equal connections is to be monitored, then it is recommended that a module block MB shown in the right of FIG. 1a or FIG. 1b be used that can be aligned adjacent to module disks MS in any desired fashion and that can be implemented with all connection functions of the module disks MS3 to MS9. In other words, it can even have three, four or six connection levels with a predetermined function (for example, A=signal, B=minus, C=PE, etc).

Figure 2:
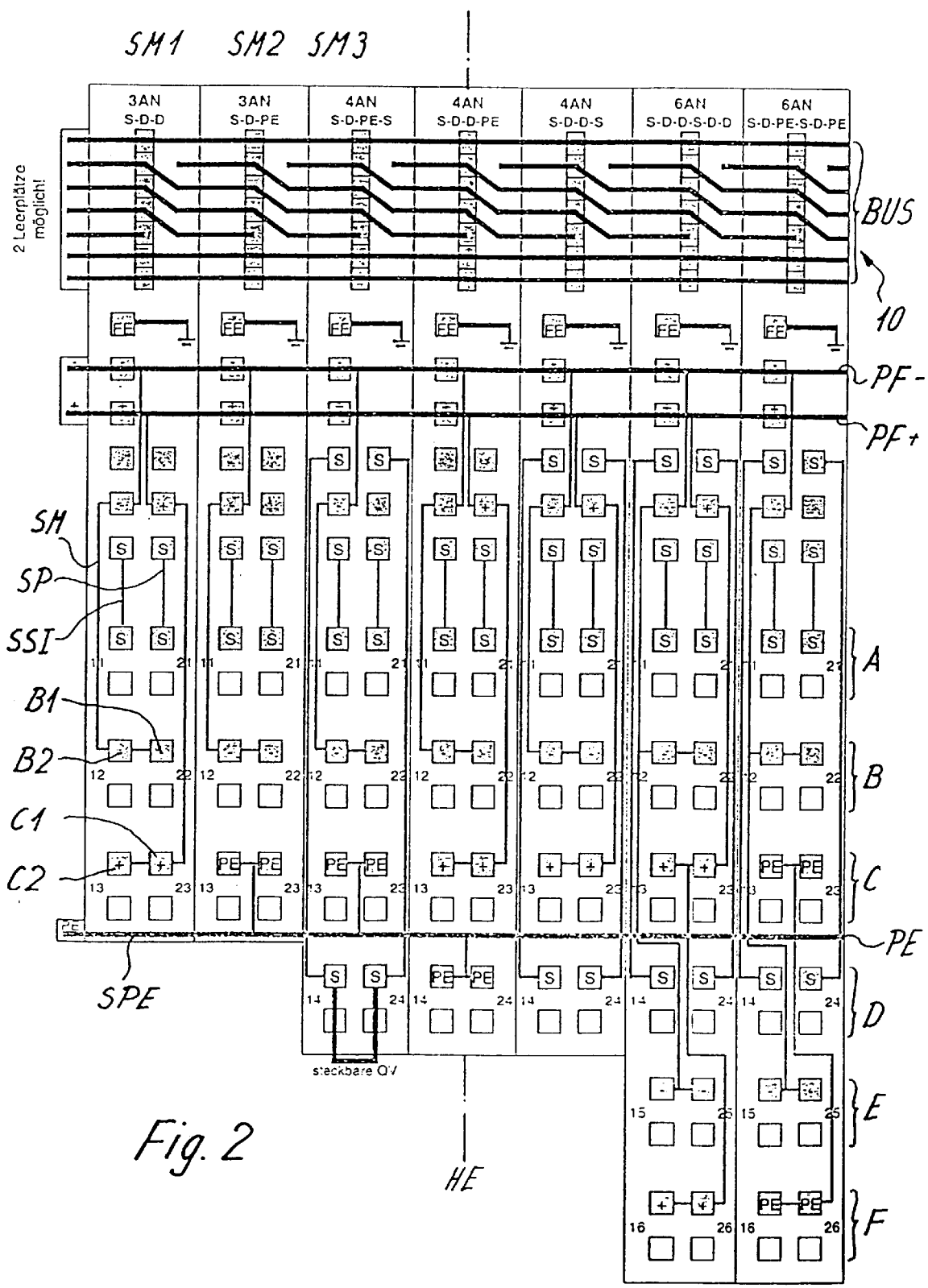
FIG. 2 is a further diagram illustrating the structure of a modular apparatus according to the invention.

The various connection disks with a common number of connection levels can differ from each other by virtue of the type of potential. This is shown in FIG. 2. Connection level A generally is used as signal level (signal connections S). The second connection level B, on the other hand, is occupied with a negative potential (−) in case of positive-switching devices. In the third connection level, the positive potential +, the ground PE or the screen will alternate. In embodiments with more than three connections, the fourth level D can be used for signal or ground connections. In the fifth and sixth levels, again in case of positive-switching devices, the negative and the positive potential or the negative potential and are provided. In case of negatively switching devices, the negative potential is replaced by a positive potential.

As described above and as shown in FIG. 2, various electrical potentials are relayed from module disk to module disk. In particular, the negative potential the positive potential + and the ground PE are relayed from module disk to module disk by power supply elements PF−, PF+ and PE. The electrical potentials, for example safety extra-low voltages but also alternating voltages, are tapped from these power supply guides and are supplied to the connection levels B to F either directly (PE) or indirectly (PF+, PF−) via an electronic printed circuit board. The potentials can then be tapped off connection levels B to F to supply the external electrical apparatus. The positive potential and the negative potential, or the ground conductor PE are through-contacted in the connection levels B and C (and also in the connection levels D, E and F if desired) in each case from connection B1 to connection B2, etc. This means that it is possible to supply the potentials to the connections B1 and B2, etc. in each case only via a single bus bar SM or SP. This is shown in FIG. 2. Bus bars SP, SM, SPE for each potential lie only on one of the two sides to the left and to the right of the main level HE. If in the second level B, for example, the negative potential and in the third connection level the positive potential is required, then it is possible to supply these two potentials on the sides of the module disks MS that face away from each other to the connection levels. This bus bar guide is extraordinarily space-saving and material-saving because one can avoid expensive double elements of bus bars to the individual connection levels. Moreover, the power supply element on both sides of module disks MS also facilitates the space-saving extension of bus bars to additional connection levels, in particular, to connection levels E and F. The power supply element PE of the ground conductor is preferably connected integrally with connection levels three (C) or four (D).

Along with the pure voltage supply function and the grounding function, the modular electrical apparatus G of the invention also facilitates the transmission of data. For this purpose, using an internal bus conductor BUS 10, data transfer takes place between gateway GW and module disks MS or module blocks MB. The electronic printed circuit board shown in FIG. 3a is used for communication between the internal bus conductor BUS and the external electrical devices whose data inputs/outputs are conducted via the connection level with the label "IS" (in the first connection level A and/or in the fourth connection level D) and on to the electronic printed circuit board 14.

In conjunction with FIGS. 3b to 3d, FIG. 3a shows various views and various elements of a module disk MS, which can be assembled with additional module disks MS and/or module blocks MB to form a connection block of variable length.

Figure 3A:
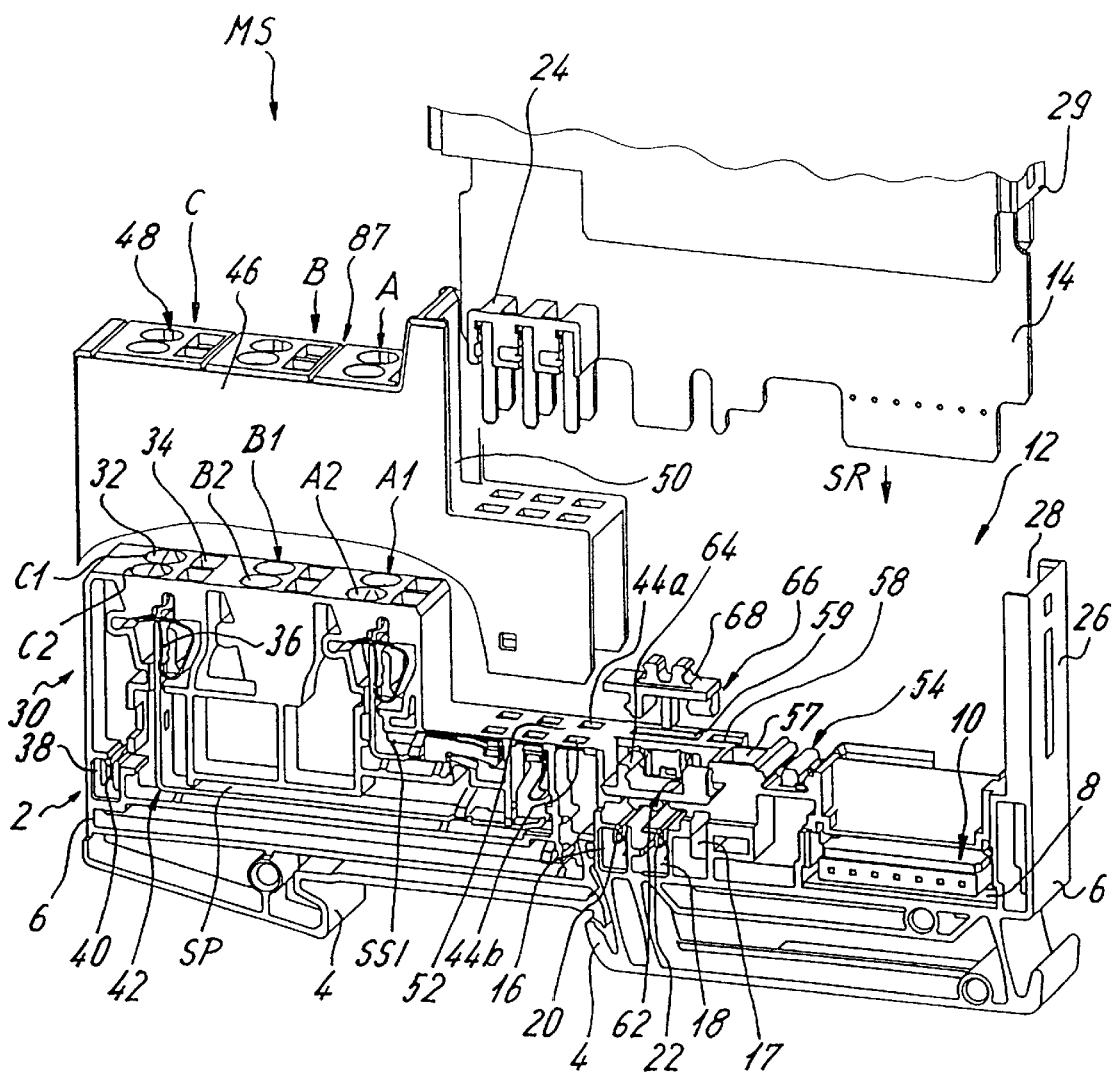
FIG. 3a is an exploded view of a first embodiment of a module disk having three connection levels.
Figure 3B:
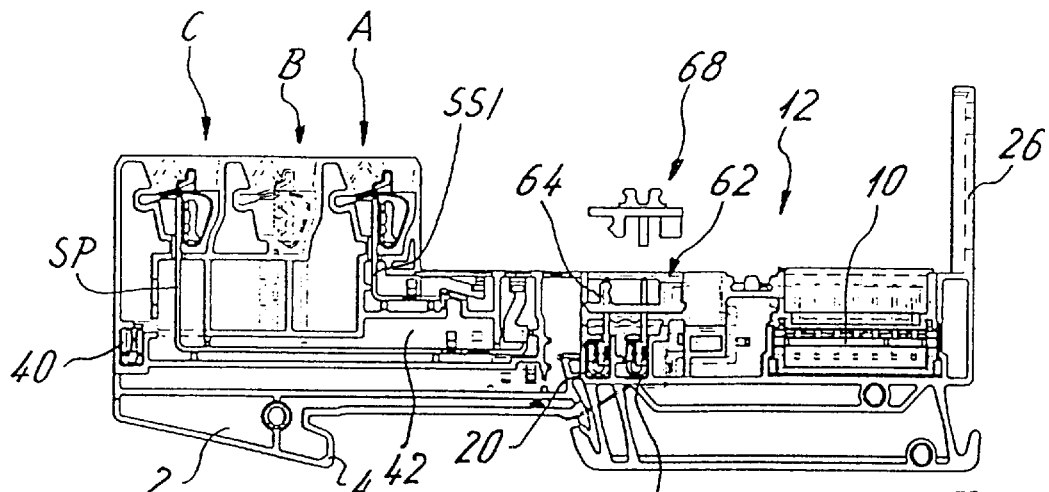
Figure 4B:
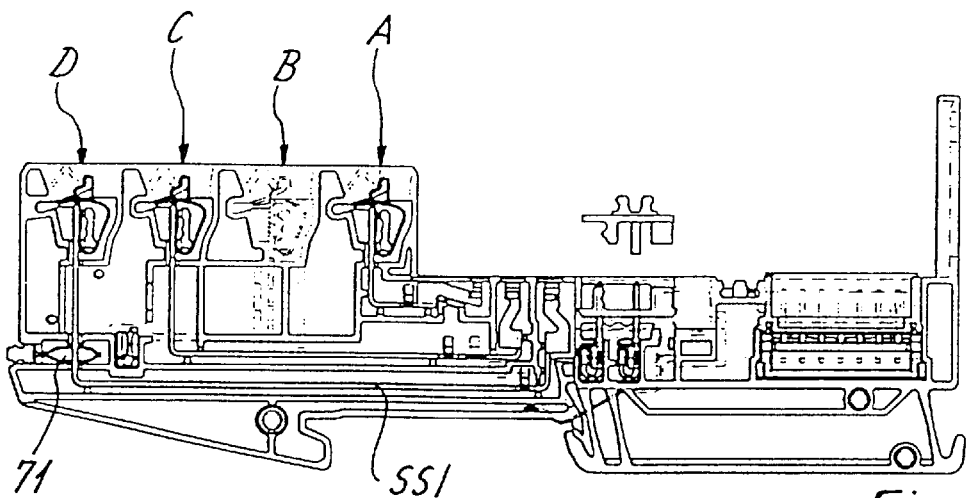

According to FIGS. 3a and 4a, module disk MS has a disk-shaped base terminal carrier 2 for the purpose of locking the individual module onto a carrier rail (not shown). Base terminal carrier 2 for this purpose is provided with plastic feet 4 with which the carrier can be latched onto the carrier rail in a known fashion. Base terminal carrier 2 comprises a lower base segment 6 that extends into an area above the carrying rail feet 4 and bilaterally next to the carrying rail feet 4 sideways beyond the carrier rail. In base segment 6 in an outer area that is so positioned as to face away from the carrying rail, there is provided a bus conductor opening 8 that penetrates the base terminal carrier 2 perpendicularly to its main level and that is intended to receive the internal bus conductor segment 10, which permits relaying the bus conductor signals from individual module to individual module and into the electronic printed circuit board.

To receive the electronic printed circuit board 14, there is provided a circumferential recess 12 in base terminal carrier 2 in the area that extends roughly from the perpendicular to the middle of the carrier rail up to the internal bus conductor segment 10. Electronic printed circuit board 14 is provided with an electronic circuit (not shown) for processing/relaying signals that are supplied to the electronic printed circuit board 14.

In the area located between the internal bus conductor segment 10 and notch foot 4, base segment 6 is provided with three additional side-by-side openings 16, 17, 18 that penetrate the base terminal carrier 2 perpendicularly to the main disk level or the main module level. Two openings 16, 18 are provided with contact elements 20, 22 that are preferably designed as integral cross members (on one side with a plug pin 20a, 22a, on the other side with a properly fitting, integrally molded socket 20b, 22b as well as molded contact recesses 20c, 22c extending perpendicularly upward). Thus, associated electric potentials, preferably the positive or negative supply potentials, are relayed from module to module. The contact elements 20, 22 thus form the power supply elements PF+ and PF−. The additional opening 17 serves merely to save material. From cross members 20, 22, these electrical potentials are supplied to the printed circuit board and/or via a suitable separate plug 24 or a plug set against the electronic printed circuit board onto the connections of bus bars SM, SP in the base terminal carrier 2 and via the former onto the connection levels of module disk MS. Recess 12 is bordered on the end of the individual module facing away from the carrier rail by a connecting member 26 that protrudes perpendicularly away from the base segment and that on its side facing toward carrying rail 4 is provided with an insertion groove 28 receiving the electronic printed circuit board 14 and an electronic housing 29.

Roughly at the end of base terminal carrier 2 that is opposite connecting member 26, there is molded on base segment 6 a connection segment 30 that protrudes perpendicularly upward and that is provided with six individual A1, A2 and double connections B1, B2, C1, C2 arranged in two rows of three each. Openings 34 with a square cross-section next to connection openings 32 for connections A1, A2, B1, B2 . . . make it possible to introduce a screwdriver for opening the spring contact elements 36 that are arranged in connection segment 30.

Figure 5A:
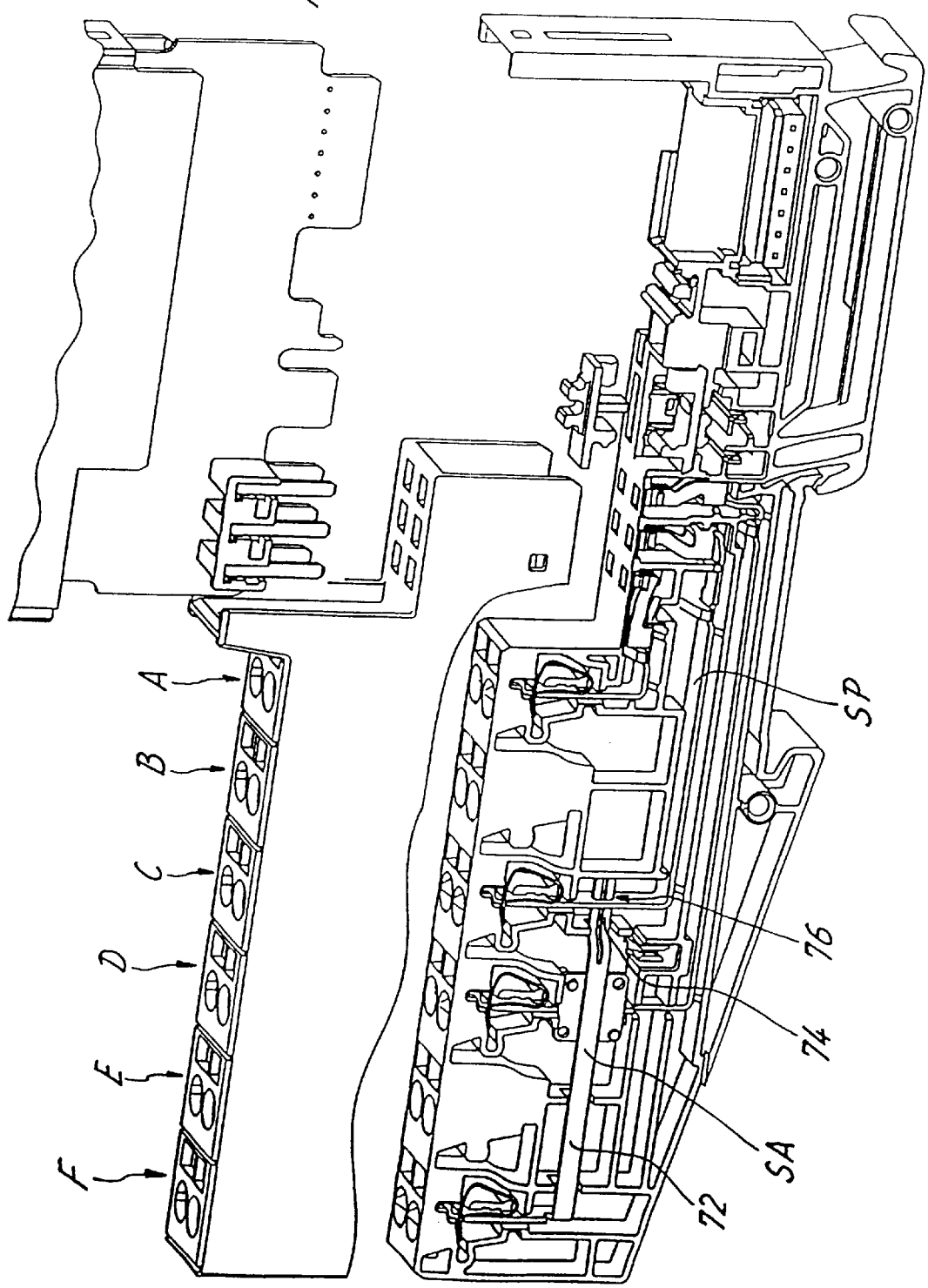
FIG. 5a is an exploded view of a third embodiment of a module disk with six connection levels.
Figure 5B:
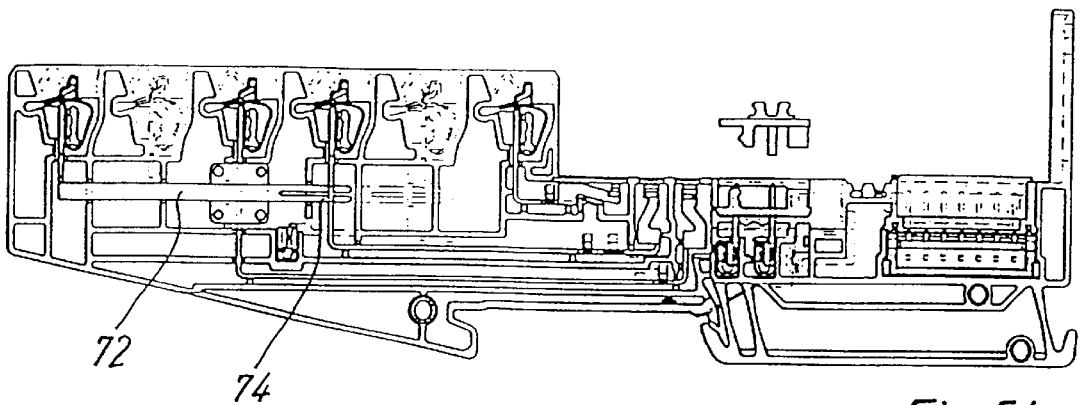
Figure 5C:
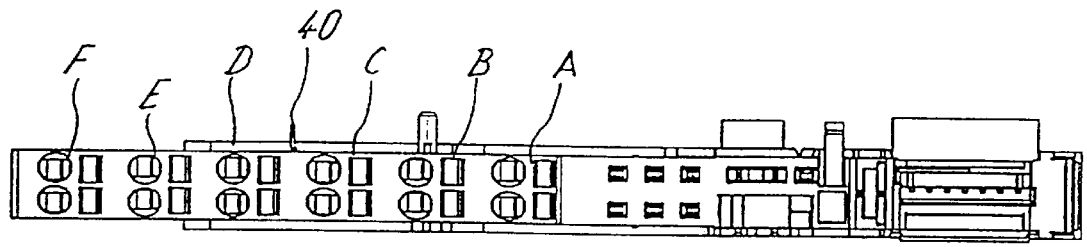
Figure 5D:
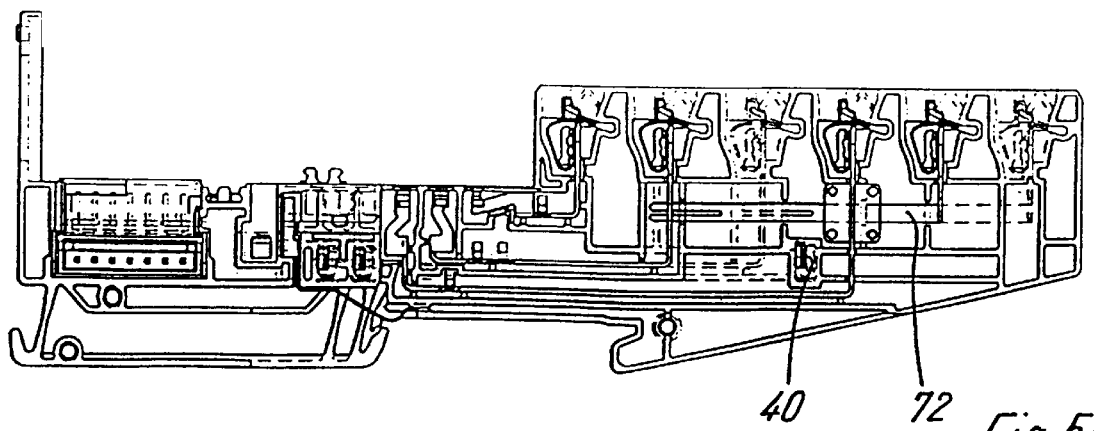

Outside the third connection level C in the base segment there is provided another opening 38 that is arranged perpendicularly to the module disk level and that penetrates base terminal carrier 2 and in which lies an additional contact element 40 via which the ground conductor PE is relayed from module to module. From contact element 40 via bus bars SPE ( FIG. 5f), a connection to one of the connection levels (for instance, C or D) can be established. In FIG. 5f, the contact elements or cross-members 40 are integral with bus bar SPE to the third connection level C, D.

The conducting connection between contact springs of connections A, B, C, . . . and of electronic printed circuit board 14 is implemented by means of bus bars SM (for the negative potential), SP (for the positive potential), and SSI (for the signal), which in each case extend from contact springs 36 in connection area 30 of the base terminal carrier 2 perpendicularly downward into base segment 6 and which then are conducted in base segment 6 to the electronic printed circuit board 14. Bus bars SM, SP run from the contact springs 36 in lateral grooves or recesses 42 of base element essentially in a u-shaped pattern on both main outside surfaces of base terminal carrier 2. Below recess 12 for the electronic printed circuit board, the bus bars are angled upward and extend to the circumferential recess 12, which in this area is provided with six connection openings 44 placed next to each other in two rows for the purpose of setting apparatus plug 24 upon the electronic printed circuit board or the printed circuit board edge. The terminal areas of bus bars SSI, SM, SP are made as sockets or receptacles and as such form the connection sockets for apparatus plug 24 to the electronic printed circuit board 14 or to the printed circuit board edge.

A space-saving arrangement of the bus bars is achieved because one of the potential-bearing bus bars SM is run on one of the outer sides (see FIG. 3d) and the other potential-bearing bus bar SP is run on the other outer side (see FIG. 3b) of the base terminal carrier 2. Through-connections between the two double connections B1 and B2, etc. that are positioned next to each other in a connection level B or C takes place only in the area of connection springs 36.

Over connection segment 30, a cover 46 made of plastic can be arranged. It has openings 48 that correspond to the connection openings 32 and openings 34. Toward the area of recess 12 of the base terminal carrier 2, the cover is furthermore provided with a lateral groove 50, which in cooperation with groove 28 receives the electronic printed circuit board 14 and housing 29 that protects electronic printed circuit board 14 and that can be mounted on base terminal carrier 2 in plug direction SR. Guide pegs F on the base terminal carrier, upon engaging a pertinent opening of the neighboring terminal, support the mechanical connection of the serially aligned terminal carriers.

Figure 3C:
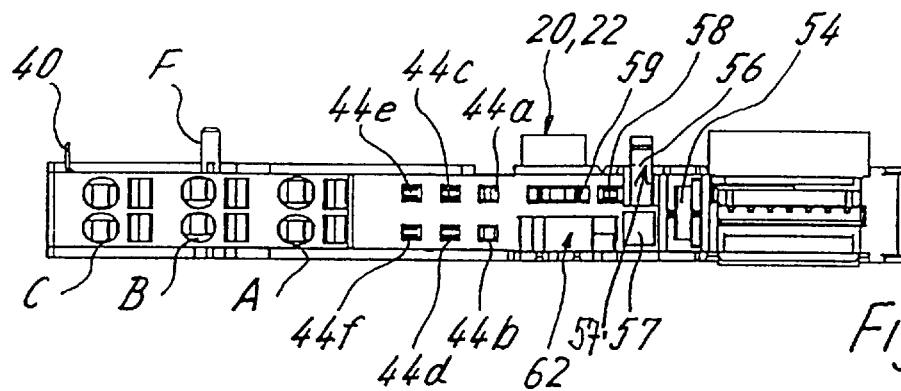
Figure 3D:
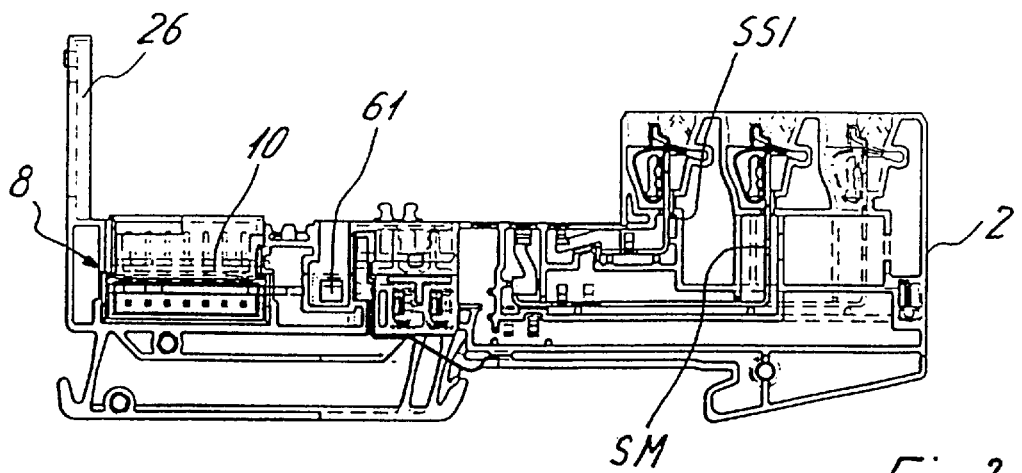
Figure 3E:
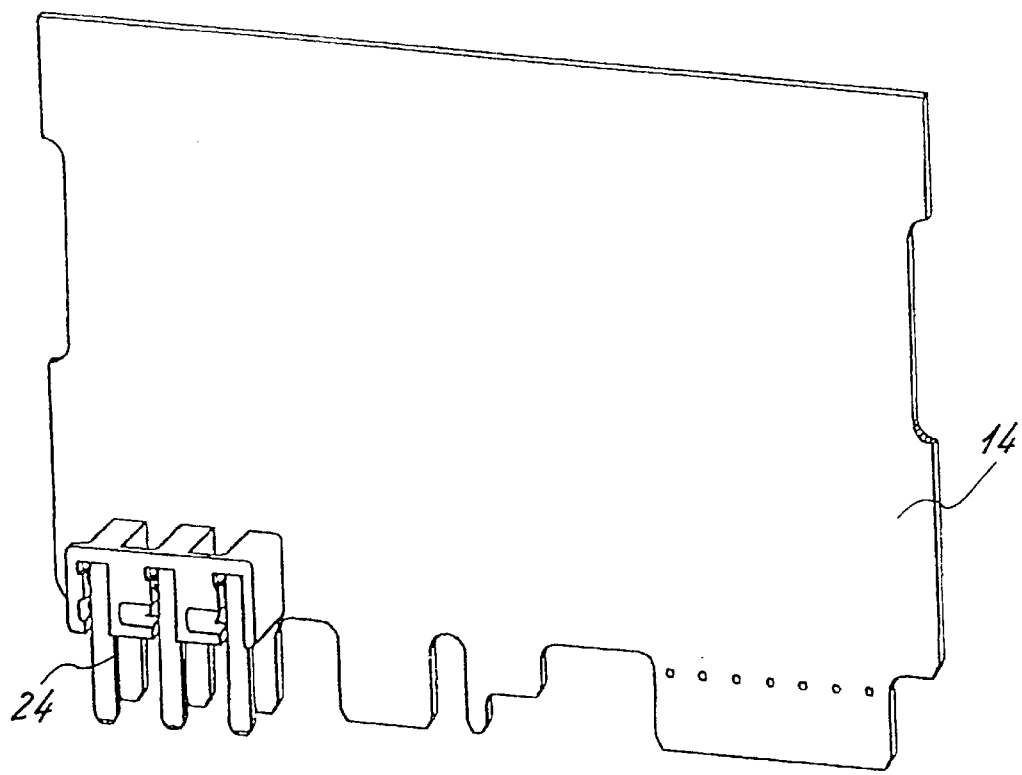
FIG. 3e is a view of the electronic printed circuit board for the module disk of FIG. 3a with an example of an apparatus plug provided directly on the printed circuit board.

Base terminal carrier 2 or module disk MS include a number of elements in the area of recess 12 under base wall 52 of recess 12 as shown in FIG. 3c. These include a module bus (opening) BUS/8, a marking strip (for one or two tags) 54, a lateral hook 56 for connection with a neighboring terminal with an opening 57 to activate the hook from above. An FE ground contact 58, a potential guide contacting opening 59 and plug socket/connection openings 44 are also provided. The plug socket/connection openings include dual signal-bus bars SSI of the fourth level D (44a, b), positive and negative bus bars to the double connections B1, B2, etc. (44c, d), and dual signal-bus bar SSI from the first connection level A (44e, f);

Next to FE contact 58 and openings 44 to the power supply elements PE+, PE−, there is provided a recess 62 for a lower segment 64 of a coding element 66 (FIG. 3a) which, upon placement of the printed circuit board or the electronic unit from housing 29 of the electronic printed circuit board 14, engages recess 62 and thus forms the counterpart for an upper coding element 68 that remains on electronic unit 12/29.

Regarding the space-saving arrangement of the functional areas of the module disk in the area of recess 12, it should be emphasized that the printed circuit board 14 is laterally offset parallel to the main level HE in housing 29 or in recess 12 so that plug pins can be molded on or plug sockets can be placed on its printed circuit board edge. That includes plug elements of the internal bus conductor (not shown) as well as one of the two rows of plug pins of the appliance plug 24 for the purpose of engaging in contact openings 44. By contacting the printed circuit board edge, separate appliance plugs can be saved that otherwise would have to take care of the particular contacts. The contacts of the power supply elements by the power supply contact opening 59 is also accomplished by plug pins (not shown) that are directly molded upon printed circuit board 14.

Another advantage of the module disk MS of the invention is that lateral hook 56 can be comfortably pressed down with a screwdriver in front of opening 57 in area 57', or from above through-opening 57. Thus, the lock to the neighboring module disk (opening 61) can easily be opened.

The bus bar guidance of the individual electrical potentials is definitely simplified in each case only on one of the two outer sides of module disk MS because the positive potential and the negative potential are guided in two openings 44c, 44d that are either side by side or that lie on both sides of the main level. In other words, the power supply elements PF+ and PF− that run parallel to the bus bar relay these two electrical potentials to the connections 44c, 44d that are placed next to each other on both sides of main level HE. Besides, only very short bus bars SSI are needed between openings 44e, 44f and connection level A because connections 44e and 44f positioned closest to connection level A are used for signal supply to the electronic printed circuit board.

Thus, the arrangement of the functional areas in the area of the electronic printed circuit board provides a particularly space-saving module disk and base terminal carrier distribution.

Figure 4C:
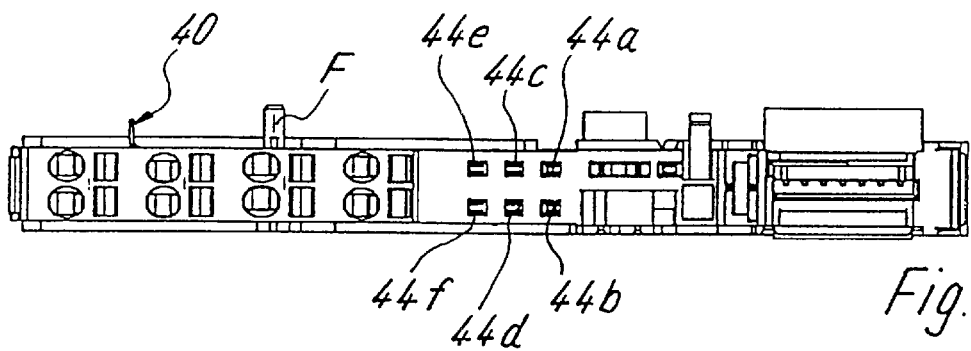
Figure 4D:
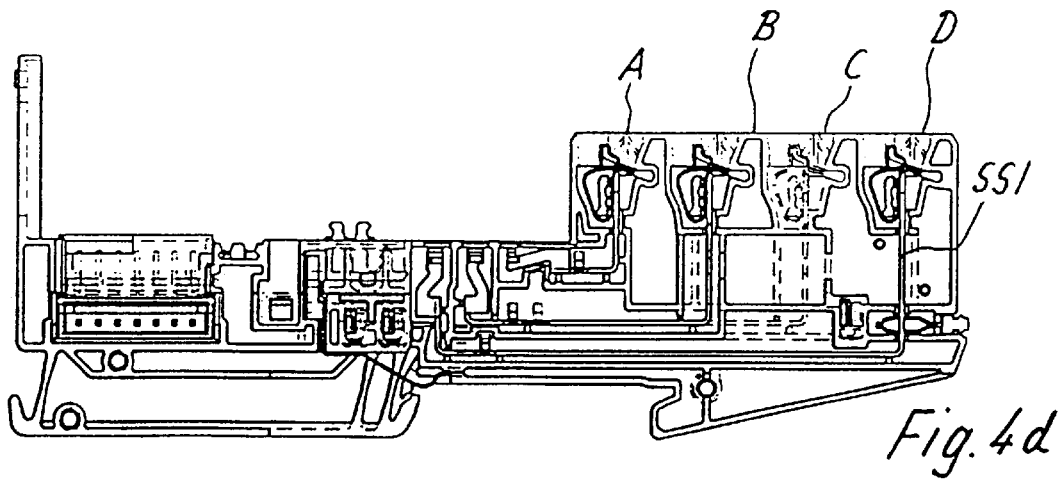

The embodiment in FIG. 4 differs from the one in FIG. 3 by the fact that the module disk has not only three but rather a total of four connection levels A, B, C, D.

With the help of the space-saving arrangement of the ground conductor PE (contacts 40) between the third and fourth connection levels C, D in the lower area of base terminal carrier 2, it is possible to provide protective conductor 40 with only very short bus bar pieces SPE (see FIG. 5f) either to connection level C or level D. The positive potential in the latter case can be applied to connection level C. Looking at it from the bus bar outside opening 38 for the protective conductor contact 40, there is provided another cross-connection opening 70, which can be equipped with cross-members 71 from which bus bars can be placed to the connection level D. As a result, the individual contacts of connection level D can be connected without any major effort (for example, for wiring a common potential within module disk MS or a module block MB and beyond several module disks MS or module blocks MB).

The embodiment shown in FIG. 5 differs from the one in FIG. 4 by virtue of additional connection levels E and F. Two possible bus bar guides of this embodiment are illustrated in FIG. 5e and FIG. 5f. In the embodiment in FIG. 5e, the first and fourth connection levels are designed as signal connection levels that extend to the openings 44a, 44b and 44e, 44f. The second and third or the fifth and sixth connection levels B, C and E, F are occupied with the negative potential and the positive potential. FIG. 5e furthermore shows the FE bus bar and the design of the terminal areas of the bus bars (SFE, SSI, SM, SP, SPE) as contact recesses 45 for the purpose of connecting additional bus bars or printed circuit board edges.

The embodiment in FIG. 5f differs merely by virtue of the fact that in FIG. 5f in the third and sixth levels, in other words, in levels C and F, the ground is placed instead of the positive potential. The power supply to the connection levels E and F is accomplished in an uncomplicated fashion by means of an extension bus bar 72, one of which is extended approximately in the middle of the module disk, while the other one is extended on one of the outer sides of the module disk turned 90° with respect to the particular bus bars that are to be extended. Extension bus bars 72 in FIG. 5e and 5f are made with a slit at one of their ends. The slit segment 74 engages openings 76 of the particular bus bars SM or SP or SPE. With the help of this technique and a corresponding layout of the bus bars on the terminal body extension of the bus bars or a continuation to the additional connection levels of connection module M can be obtained.

Figure 6:
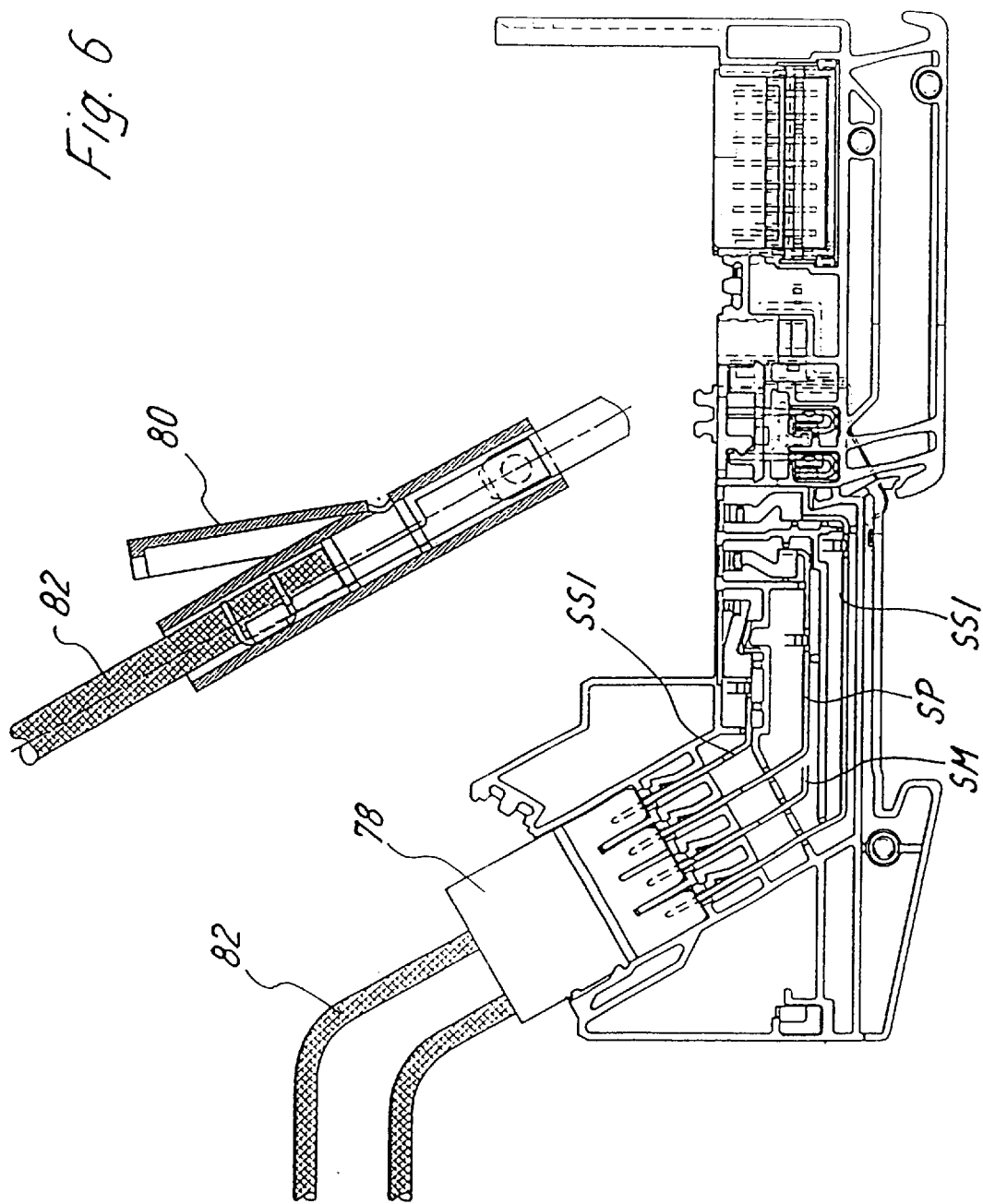
FIG. 6 is an exploded side view of another embodiment of the invention.

The embodiment shown in FIG. 6 differs from the embodiments in FIGS. 3 to 5 by virtue of the connection technique that is used. Instead of the connection levels using screws or springs, the external devices are connected by means of space-saving plugs 78 that in each case are provided with a terminal or cutting device 80 for firm clamping action and possibly for penetration of the insulation from the conductors 82 inserted in plug 78.

In FIG. 7, the connection module is made as a module block MB with six connection levels A to F. Module block MB still has a disk-shaped structure. However, only a single overlapping electronic printed circuit board (not shown) as well as a single overlapping electronic housing 29 (not shown) and a single cover 46, that spans several base terminal bodies 2 together for the connections of connection levels A, B, . . . are used. Moreover the electrical potentials PE, + and − are supplied only in one or both of the disks 2 that are on the front with respect to the carrier rail by means of bus bars SM, SP, SPE from the power supply elements PE, PF+ and PF− the way to the connection levels B to F. These potentials are transferred from disk to disk via cross-connectors 84 that are provided with pegs or stubs 85, which engage receiving sockets 86 that are molded upon bus bars SM, SP or SPE. The cross-connectors 84 can be provided with the clamping spring connections 36 and are provided on the cover 46, through which they dip into the base terminal carriers 2 as the cover 46, is arranged in place. Cover 46, and the cross-connectors are covered toward the top a lid 89. The bus bars of the power supply elements (PF−, PF+ and/or PE) of the module blocks (MB) include bus bar segments with differing lengths.

Extension bus bar 72' of the module block (MB) are aligned and twisted by 90°. At their ends, they are provided with receiving sockets 86 extending upwardly, for the purpose of receiving the pegs 85 of the cross-connectors 84. Extension bus bars 72 that are rotated by 90° are preferably separated from the potential of the bus bar of connection level D by insulation disks that are separately insertable or insulation disks that are sprayed upon the base terminal carrier.

Figure 1C:
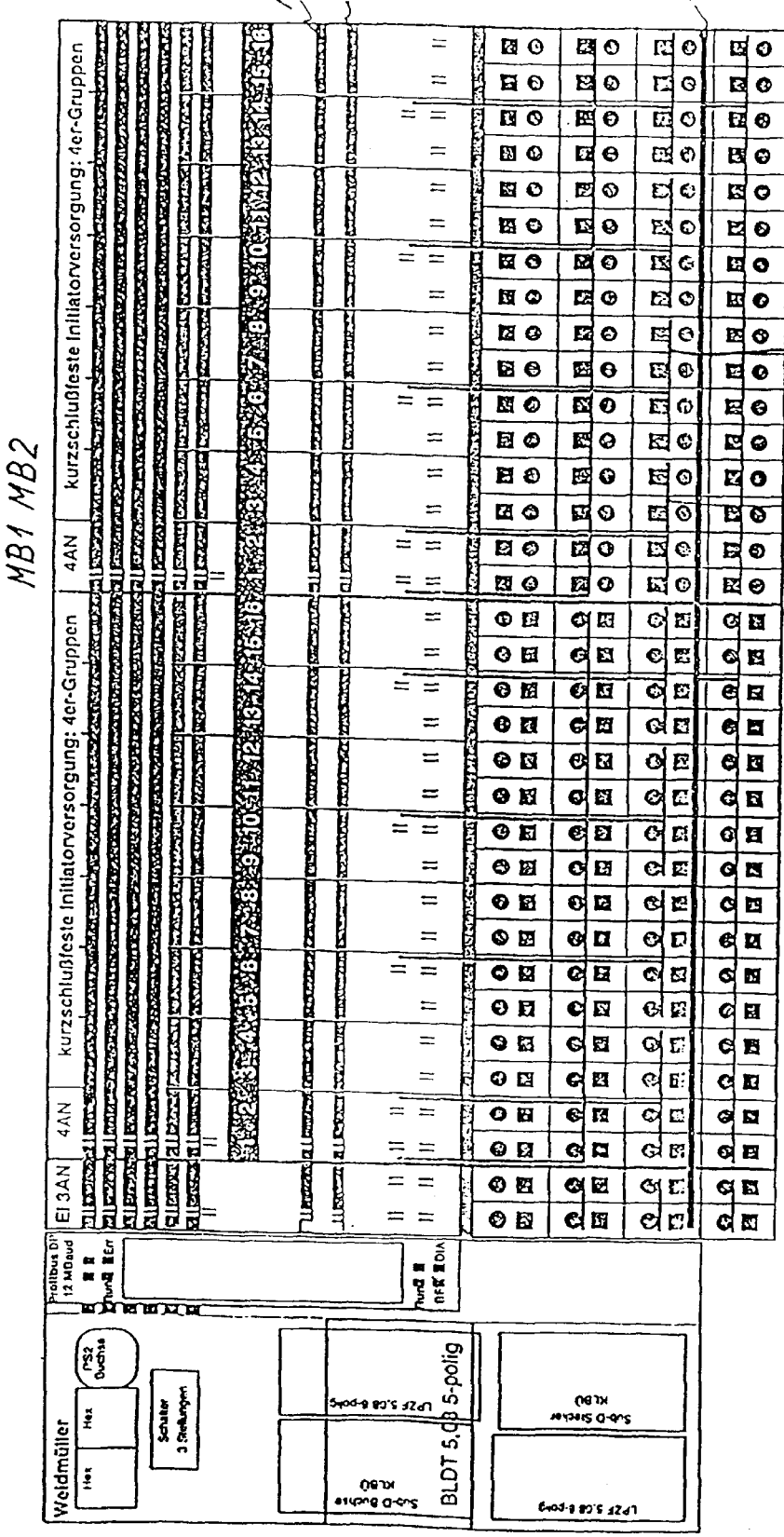
Figure 1D:
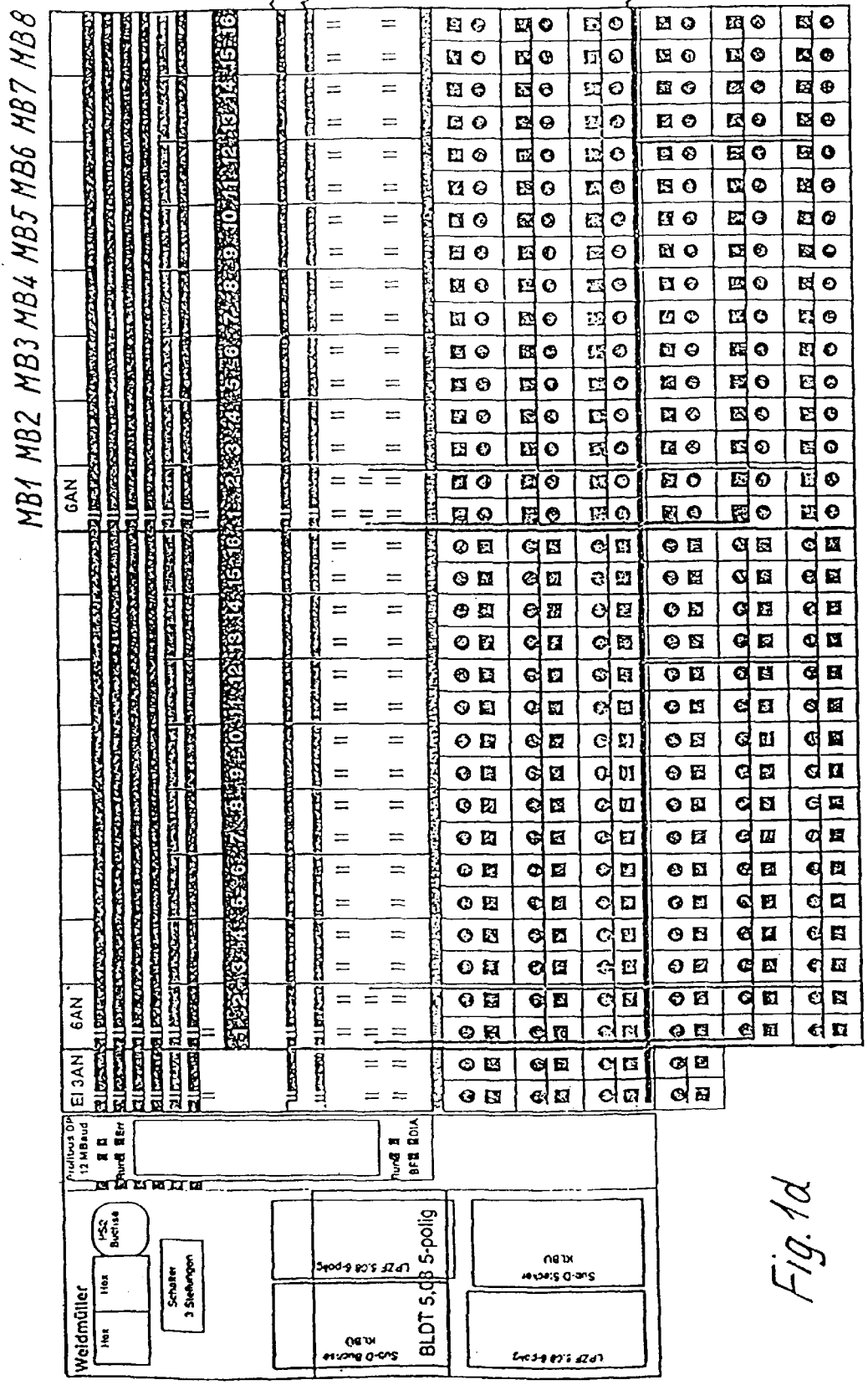
Figure 7A:
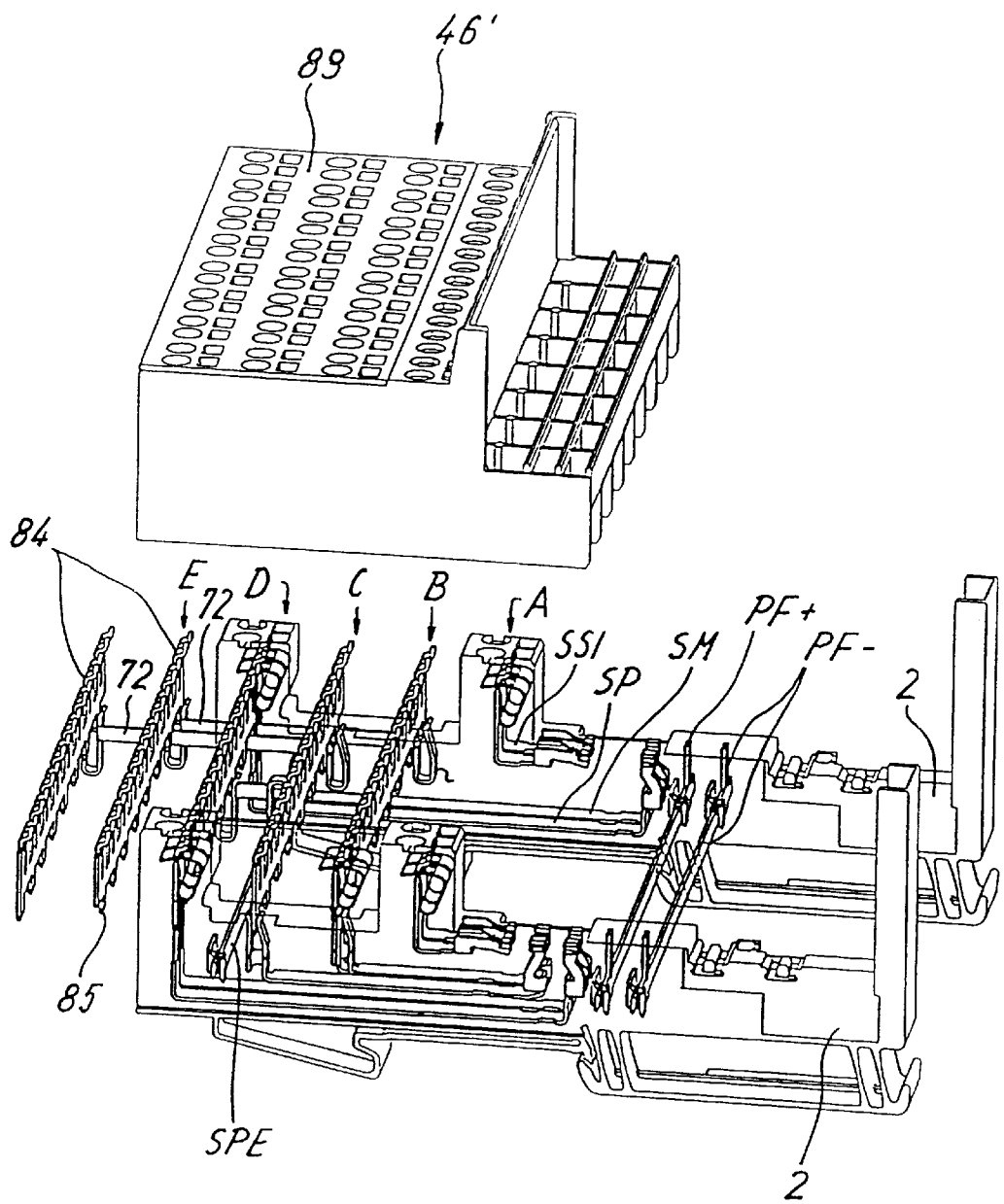
FIG. 7a is an exploded view showing various elements of a module block according to yet another exemplary embodiment of the invention.
Figure 7B:
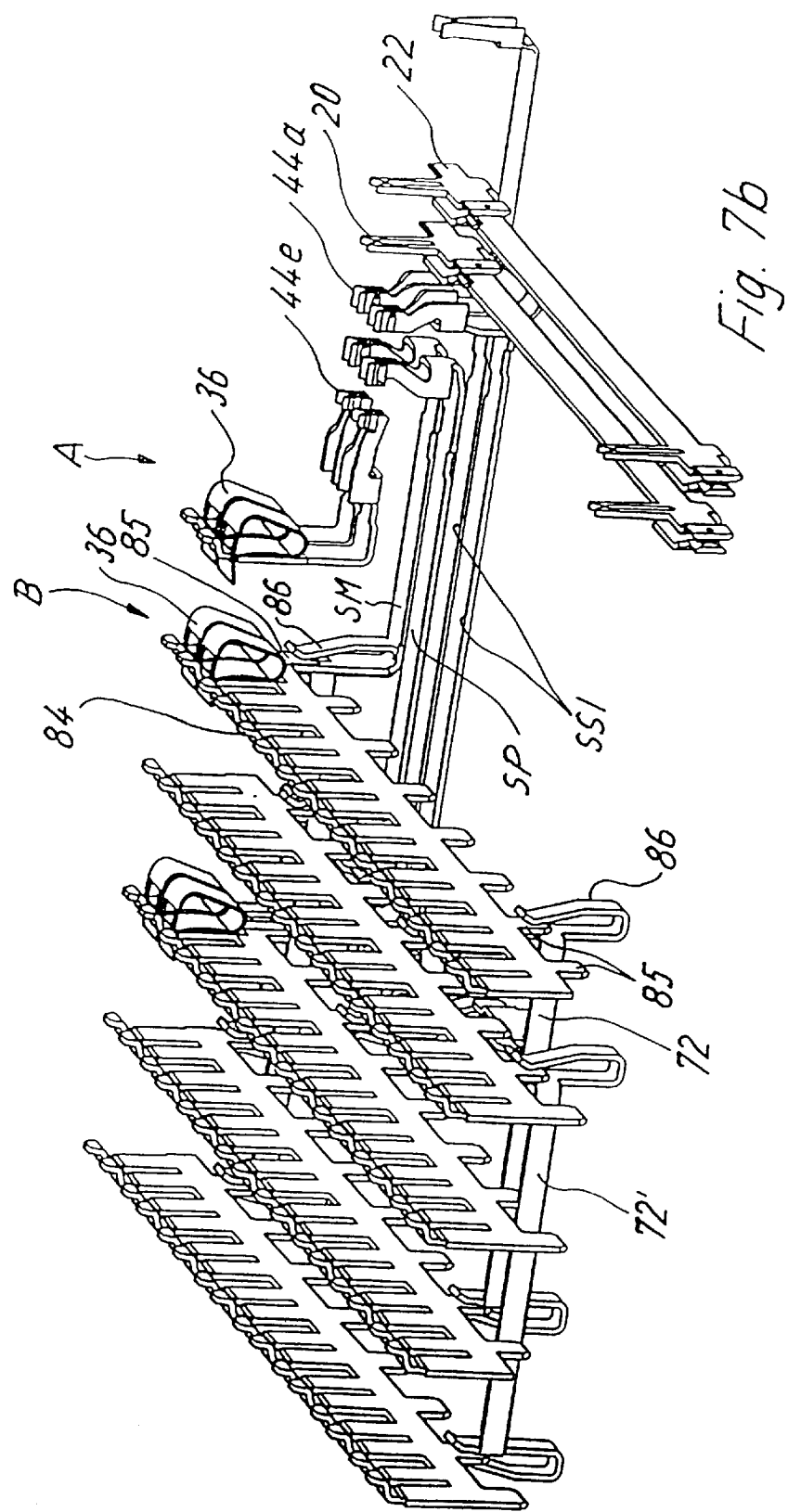
Figure 7C:
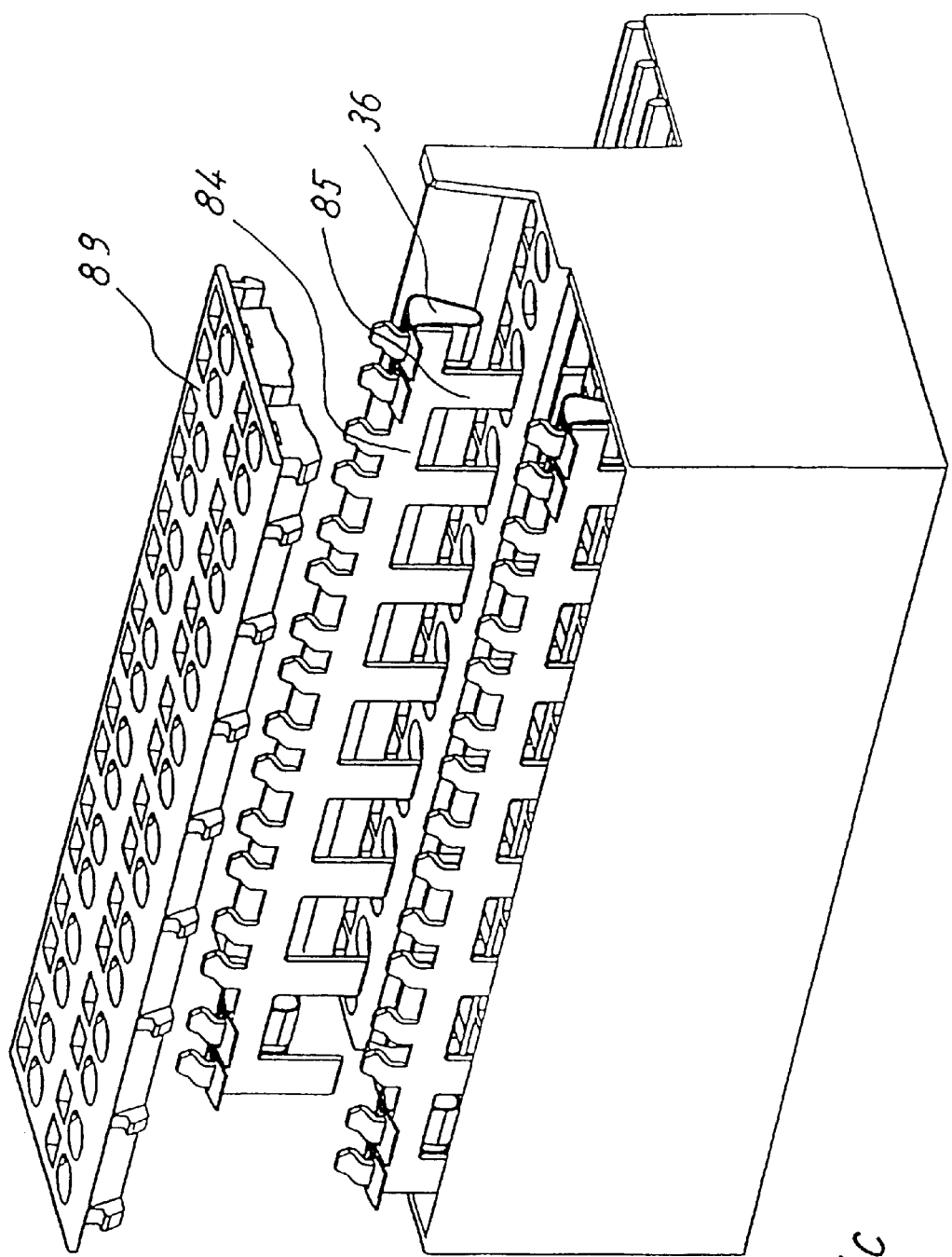
Figure 7D:
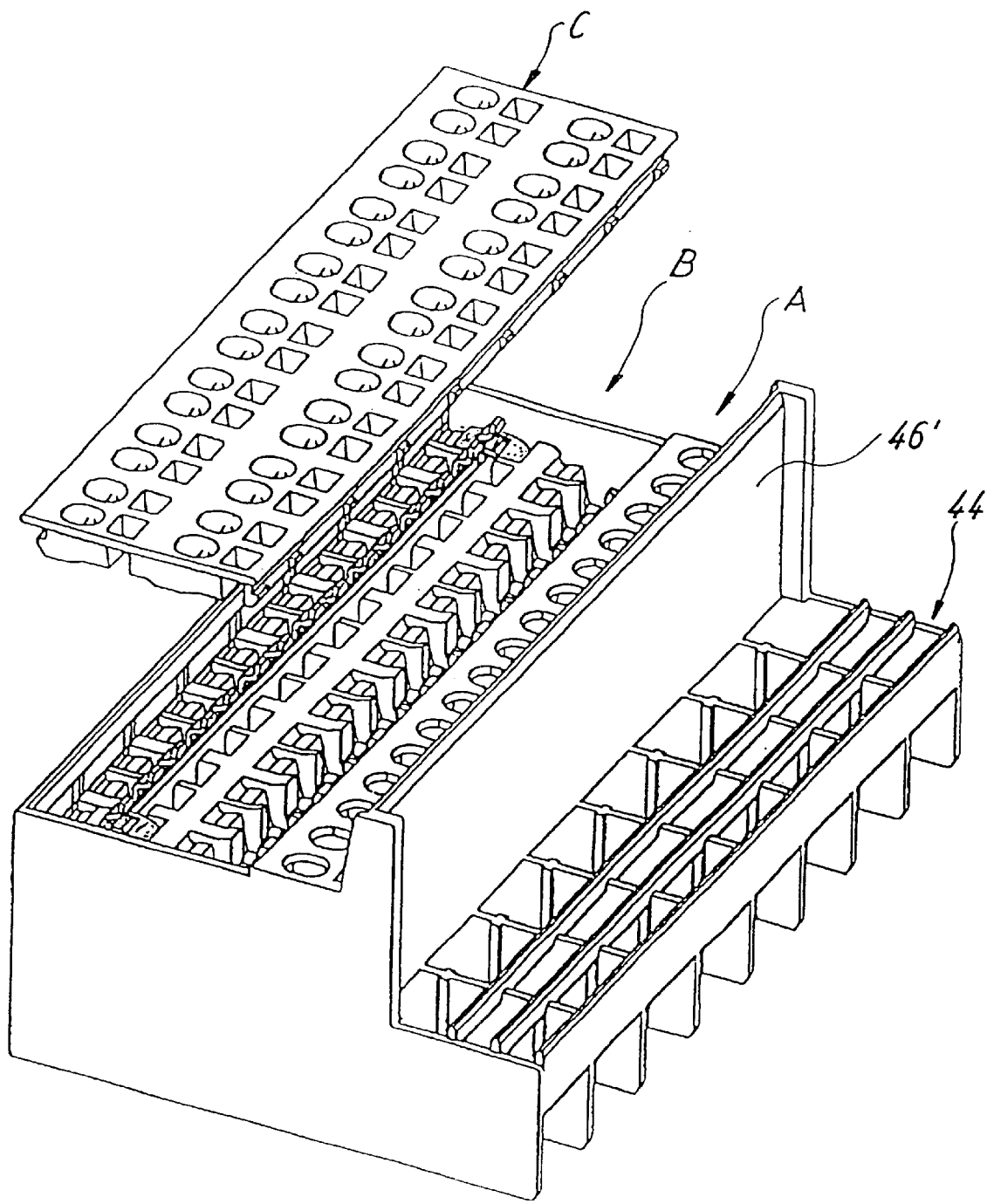

Referring now to FIG. 11, a version of a PE cross-member 118 in the module blocks MB is arranged perpendicularly to the lateral recesses 42 of base terminal carriers 2 and at its ends has at least one upwardly extending receiving socket 120 for contacting the cross-connectors 84 and a downwardly extending receiving socket for contacting bug bar SPE. FIGS. 1c and 1d as well as FIG. 7b show that the bus bars of the power supply elements PF−, PF+ or PE of the module blocks MB can comprise a single overlapping bus bar segment or several bus bar segments of different length as shown in FIG. 1, i.e. MB1 and MB3 with regard to the PF+ guide. It is also possible that in the case of the module blocks MB, the potential guides PF−, PF+ and/or PE are assembled with the cross-members 20, 22 of the disk structure. For the block structure, one could use either a base terminal carrier 2 that overlaps the entire block (not shown) or one could employ the disk-like base terminal carriers 2, for instance, in the manner of FIG. 3. In this embodiment, one could assemble several of the base terminal carriers and possibly also several of the connection and/or electronic housings 46, 29 for a disk structure in the manner of a preassembled unit prior to mounting on a carrier rail to obtain an overlapping block. For instance, by means of a rod or by means of dovetail connections, for instance, between the cover housings 46 or the base terminal carriers 2.

Compared to a structure formed of module disks MS that can be separated from each other completely, with the help of module block MB, achieve a considerable material saving can be obtained as well as a cost saving that will make the block structure economical, especially for controlling or monitoring a larger number of uniform devices. The module block MB can be aligned as desired with additional module blocks MB, but also with individual module disks MS. The system can thus be made as a simple disk structure and as a pure block solution or a mixture of the two. The system is completed by a closure plate that is not shown.

Between the connection levels, the cover 46 of the module blocks is provided with grooves 87 for the clear matchup of a screwdriver guide, conductor insertion, colored electrical potential labels and labeling of a connection or for establishing boundaries against other connection levels and to receive colored electrical potential labels markings.

Figure 8:
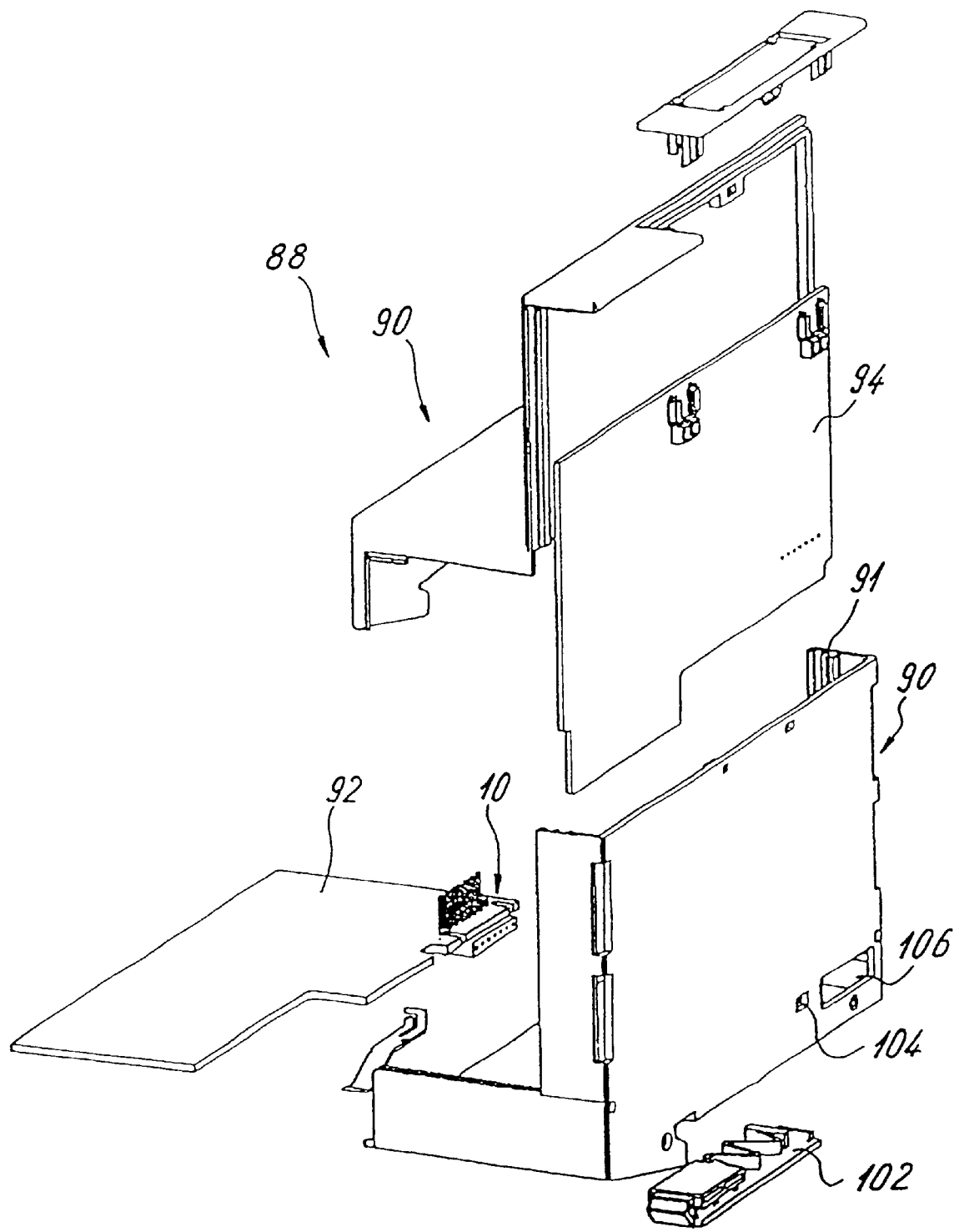
FIG. 8 is an exploded view of the elements of a gateway.

FIG. 8 shows an illustration of a gateway housing 88 whose walls 90 are adapted to the design of module disks MS. The housing is provided with a recess for an FE contact as well as with printed circuit board guides 91 for a horizontally aligned connection printed circuit board 92 and an electronic printed circuit board 94 that is aligned perpendicularly thereto, which can be mounted on the connection printed circuit board 92. A recess is provided for an elastic foot 102. Housing openings 104 and 106 are provided for contacting the internal bug conductor segment and the hook of the first module disk MS that is serially aligned on the gateway.

Particular advantages of this housing reside in its simple structure as well as in the complete envelopment of the printed circuit boards by the bipartite housing 88. Trouble on the field bus cable can be diverted directly via the FE contact on the connection printed circuit board to the carrier rail. Gateway GW makes it possible to connect an external field bus. The feed-in disk, which is also designed as module disk MS, adjoins the gateway. It is particularly advantageous that the current and voltage supply of the gateway GW and the connection module M is accomplished via the feed-in disk MS that is serially aligned upon gateway GW (preferably via the internal bus conductor segment).

Figure 9A:
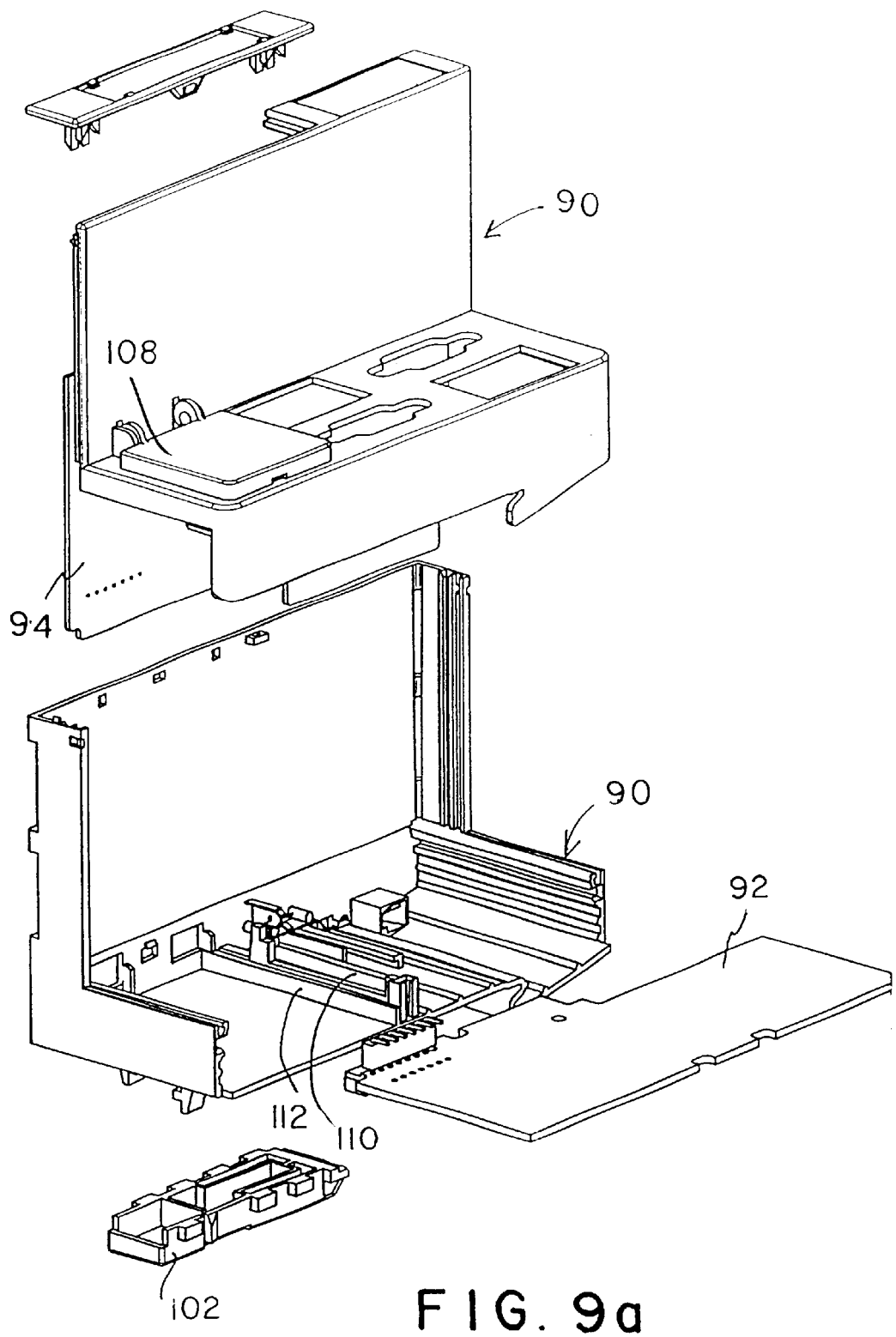
FIGS. 9a and 9b are exploded views, respectively, of a second embodiment of a gateway.
Figure 9B:
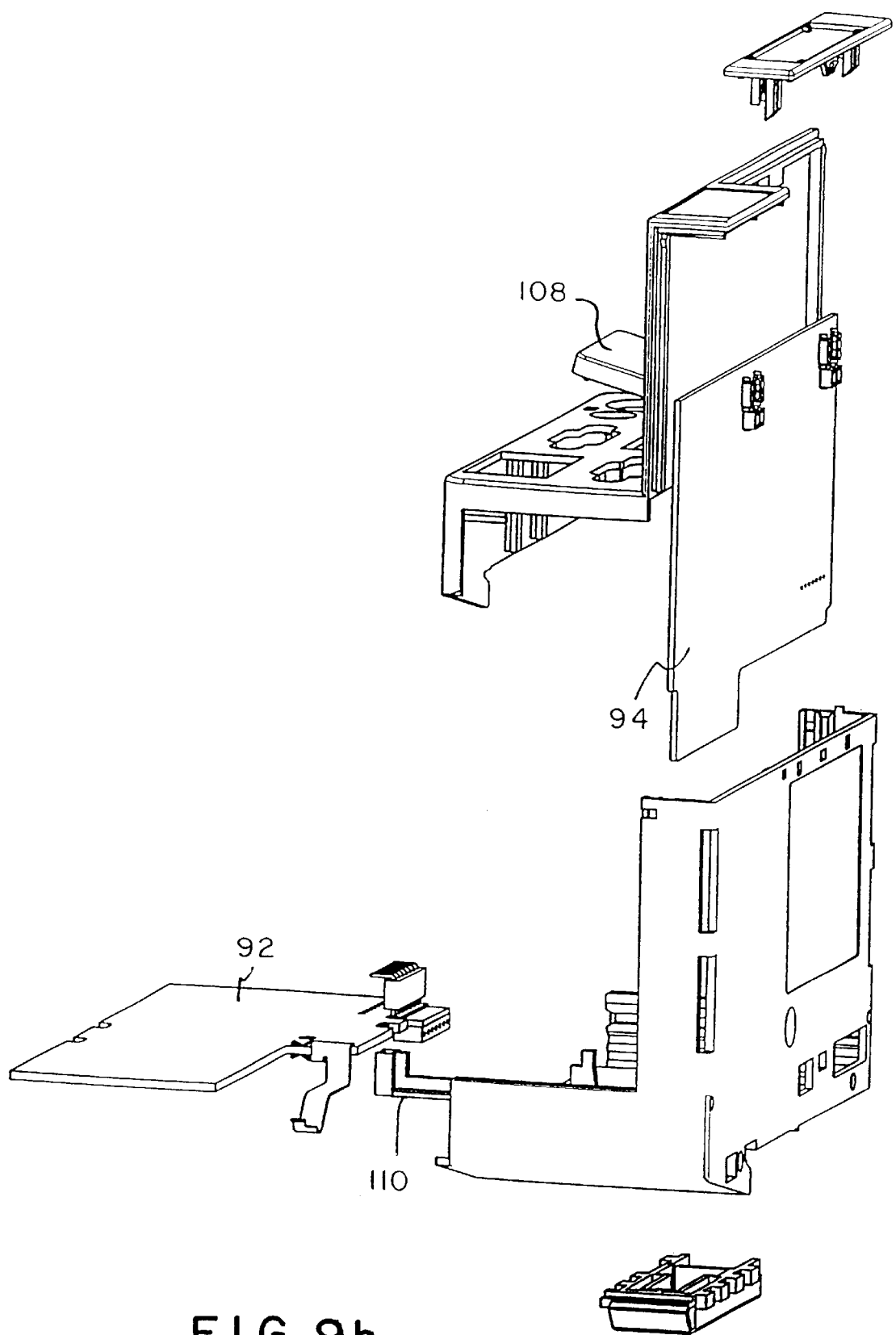

FIG. 9a and FIG. 9b show an alternative to the gateway from FIG. 8. A protective flap 108 advantageously covers a plug connection (otherwise not illustrated in FIG. 9), for example, for a service plug or a hex rotary coding switch.

To stabilize and support walls 90 of housing 88, a supporting rod 110 is inserted in a profile groove 112 of the lower wall 90, which in this case is positioned horizontally.

FIG. 10 illustrates the assembled state of a base terminal carrier 2, along with the cover 46 and electronic housing 29 in place. The side of the cover 46 that is opposite connecting member 26 and electronic housing 29 are moved together by elements 114, 116. A locking device is also provided.

Figure 11A:
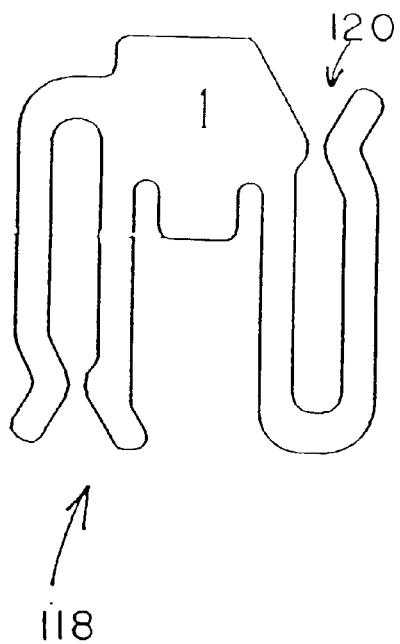
FIGS. 11a and 11b are plan views of two contact elements, respectively, for a module block of FIG. 7.
Figure 11B:
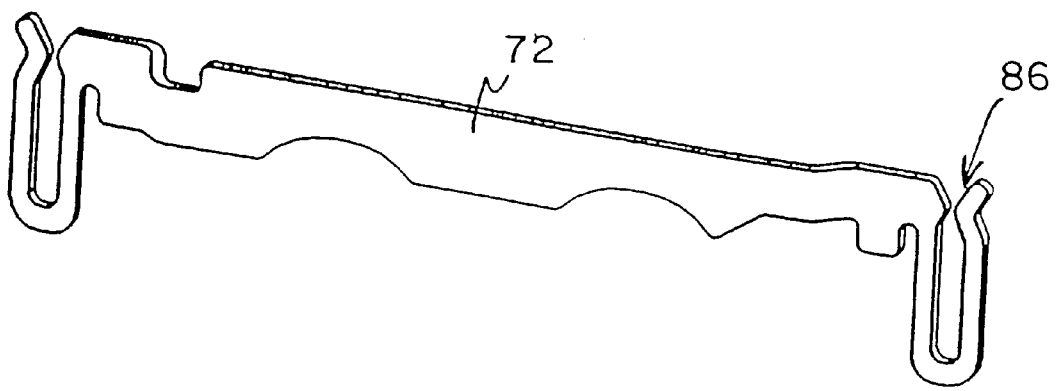

FIG. 11a shows the additional PE cross-member 118 and FIG. 11b shows another variation of an extension bus bar 72 for the block structure. The advantage of these alternatives resides in the fact that the elements are simply punched out of a sheet metal strip as punched parts. The receiving sockets 86 or 120 lie in the plane of the other extension bus bar 72 or the other cross-member 118.

While in accordance with the provisions of the patent statute the preferred forms and embodiments of the invention have been illustrated and described, it will be apparent to those of ordinary skill in the art that various changes and modifications may be made without deviating from the inventive concepts set forth above.

What is claimed is:

1. A modular electrical apparatus for controlling and monitoring operations, comprising:
    (a) at least one connection module (M) for mounting on a carrier rail and having a plurality of connection levels for the connection of external conductors, said module including a plurality of disk-shaped base terminal carriers (2) arranged in series and including at least one bus bar (SM, SP, SSI);
    (b) an internal bus conductor (BUS) and a plurality of power supply elements (PF+, PF−, PE) for positive, negative, and ground potential arranged within each module and extending parallel to the rail, said power supply elements being connected with said connection levels via said bus bars; and
    (c) said bus bars extending between said power supply elements and said connection levels on opposite sides of said base terminal carrier, with connections to be supplied by a common potential being connected directly with each other to form multiple connections, thereby to minimize the space requirements of the module.

2. Apparatus as defined in claim 1, wherein each module comprises at least one aligned module disk (MS) and at least one aligned module block (MB) arranged on said serial base terminal carriers which are also formed as disks, said module disks and module blocks each including at least one electronic printed circuit board (14), housing (29), and cover (46).

3. Apparatus as defined in claim 2, wherein said printed circuit board, said housing, and said cover of said module blocks overlap several base terminal carriers and wherein said cover, printed circuit board, and housing of said module disks overlap one of said base terminal carriers.

4. Apparatus as defined in claim 2, wherein one of said printed circuit boards and one of said housings overlap several serially aligned module disks and wherein one module block is provided with several housings and printed circuit boards.

5. Apparatus as defined in claim 1, wherein said power supply elements are assembled from cross-members arranged in openings in said base terminal carriers that face the carrier rail.

6. Apparatus as defined in claim 2, wherein two of said power supply elements provide positive and negative potentials, respectively, below a recess (12) which receives said printed circuit board and said housing and wherein another of said power supply elements provides protective ground potential between third and fourth connection levels.

7. Apparatus as defined in claim 1, wherein said base terminal carriers contain lateral recesses (42) for said bus bars which extend between said connection and openings for receiving a plug and an edge of a printed circuit board.

8. Apparatus as defined in claim 5, wherein a bus bar (SPE) for connecting a ground power supply element is integrally molded on a cross-member (40) of the ground power supply element with the connection level (C, D) for the ground potential (PE).

9. Apparatus as defined in claim 5, wherein positive and negative potentials are connected from the cross-members of the power supply elements (PF+, PF−) to one of the connection openings (44c, 44d) for an appliance plug on opposite sides of the base terminal carrier.

10. Apparatus as defined in claim 1, wherein terminal areas of said bus bars form connection contacts for additional bus bars and printed circuit board edges.

11. Apparatus as defined in claim 1, wherein said bus bars have end portions defining one of spring contacts, screw, and plug connections.

12. Apparatus as defined in claim 1, wherein said bus bars have end portions defining contact recesses for an appliance plug and an edge of a printed circuit board.

13. Apparatus as defined in claim 1, and further comprising extension bus bars (72) adjacent to said bus bars for connecting the power supply elements between connecting levels of said base terminal carriers.

14. Apparatus as defined in claim 13, wherein said extension bus bars are rotated 90° relative to said bus bars.

15. Apparatus as defined in claim 14, wherein said extension bus bars have flexible portions (74) at one end which engage openings of the bus bars to be extended.

16. Apparatus as defined in claim 2, and further comprising
cross-connectors (84) including stubs (85) for engaging sockets (86) on said bus bars for relaying potential from said power supply elements to said connection levels via said bus bars.

17. Apparatus as defined in claim 1, wherein said bus bars comprise bus bar segments of different lengths.

18. Apparatus as defined in claim 16, and further comprising extension bus bars (72) adjacent to said bus bars for connecting the power supply elements between connecting levels of said base terminal carriers, said extension bus bars including sockets for receiving stubs of said cross-connectors.

19. Apparatus as defined in claim 14, and further comprising insulation disks for separating said extension bus bars (72) from the electrical potential of the bus bar of one of said connection levels (D).

20. Apparatus as defined in claim 16, wherein a cross member (40) for a ground supply PE in a module bock is arranged perpendicular to a lateral recess (42) in said base terminal carrier, said cross member including receiving sockets for receiving stubs of said cross-connector and for contacting a bus bar (SPE).

21. Apparatus as defined in claim 16, and further comprising a cover in which said cross-connectors (84) are mounted whereby when said cover is placed on said base terminal carriers of said module block, said cross-connectors engage said base terminal carriers and form a contact segment of said multiple connections.

22. Apparatus as defined in claim 6, wherein said connection levels comprise for positive switches
(1) a first connection level (A) for a first signal level;
(2) a second connection level (B) for a negative potential;
(3) a third connection level (C) for one of a positive potential, ground, and screen;
(4) a fourth connection level (D) for one of a ground and second signal level;
(5) a fifth connection level (E) for a negative potential; and
(6) a sixth connection level (F) for one of a positive potential and ground, whereby in the presence of negative switches, the positive and negative potential connection levels are reversed.

23. Apparatus as defined in claim 16, wherein said cross-connectors have different lengths, whereby the electrical potential within a connection level of a module block varies.

24. Apparatus as defined in claim 22, wherein said module disks include
(1) an opening (8) below said recess (12) for receiving a bus conductor segment;
(2) a marking strip (54)
(3) a hook (56) for connection with an adjacent module disk;
(4) a ground contact (58);
(5) an opening (59) for receiving an electrical contact; and
(6) connecting means (44) for connecting said bus bars with a plug on a printed circuit board.

25. Apparatus as defined in claim 24, wherein said connecting means comprise
(1) a signal bus bar (SSI) connected with a fourth connection level (D);
(2) positive and negative bus bars connected with the multiple connections; and
(3) dual signal bus bars (SSI) connected with the first connection level.

26. Apparatus as defined in claim 24, wherein said module disks further include a recess (62) for receiving a coding element (66).

27. Apparatus as defined in claim 24, wherein said ground contact (58) is integral with said module disk and has an end portion which directly contacts an edge of said printed circuit board.

28. Apparatus as defined in claim 24, wherein said printed circuit board includes plug contact pins molded thereon.

29. Apparatus as defined in claim 24, wherein said module disks contain an opening (57) adjacent to said hook for receiving an implement to disengage said hook from an adjoining module disk.

30. Apparatus as defined in claim 16, wherein said base terminal carriers include four connection levels and contain a transverse opening (70) beneath a fourth connection level for receiving a cross-connector for providing electrical potential.

31. Apparatus as defined in claim 2, wherein said base terminal carriers contain a transverse bus conductor opening (8) for receiving an internal bus conductor segment (10).

32. Apparatus as defined in claim 31, wherein an internal bus conductor segment (10), power supply elements, and a coupling hook (56) are plugged together on the base terminal carriers of the module disks and module blocks.

33. Apparatus as defined in claim 32, wherein an electronic printed circuit board of a module block is connected with the module block via said base terminal carrier.

34. Apparatus as defined in claim 33, and further comprising a gateway (GW) adjacent to a first module disk for receiving an external field bus.

35. Apparatus as defined in claim 34, wherein a current and voltage supply of said gateway and said connection module is via a feed module disk aligned with said gateway.

36. Apparatus as defined in claim 35, wherein said gateway comprises a sectional housing and includes two printed circuit board guides which are offset by 90°.

37. Apparatus as defined in claim 36, wherein said gateway is connected with said base terminal carriers and with said internal bus conductor segment of said module blocks and said module disks.

38. Apparatus as defined in claim 33, and further comprising a closure plate.

39. Apparatus as defined in claim 31, wherein a last module disk includes a connection for said internal bus conductor segment, power supply elements, and for additional modules on another carrier rail.

40. Apparatus as defined in claim 2, wherein said covers between connection levels contain grooves for alignment and labeling.

41. Apparatus as defined in claim 1, wherein said bus bars at least partially comprise light conductor elements.

42. Apparatus as defined in claim 2, wherein said covers and said housings include interlocking members for connecting adjacent covers and housing.

43. Apparatus as defined in claim 2, wherein a plurality of said base terminal carriers and said covers and housings are preassembled as a unit prior to mounting on a carrier rail to form a single overlapping module block.

44. Apparatus as defined in claim 34, and further comprising a housing for said gateway, said housing including a reinforcing rod (110).

45. Apparatus as defined in claim 2, wherein said base terminal carrier of a module block includes a lower portion upon which disks are mounted.

46. A modular electrical apparatus for controlling and monitoring operations, comprising:

(a) at least one connection module (M) for mounting on a carrier rail and having a plurality of connection levels for the connection of external conductors, said module including a plurality of disk-shaped base terminal carriers (2) arranged in series and including at least one bus bar (SM, SP, SSI);

(b) an internal bus conductor (BUS) and a plurality of power supply elements (PF+, PF−, PE) for positive, negative, and ground potential arranged within each module and extending parallel to the rail, said power supply elements being connected with said connection levels via said bus bars;

(c) at least one aligned module disk (MS) and at least one aligned module block (MB) arranged on said serial base terminal carriers which are also formed as disks, said module disks and module blocks each including at least one electronic printed circuit board (14), housing (29), and cover (46); and (d) a plurality of cross-connectors (84) including stubs (85) for engaging sockets (86) on said bus bars for relaying potential from said power supply elements to said connection levels via said bus bars.

* * * * *